United States Patent
Suga

(10) Patent No.: US 12,198,859 B2
(45) Date of Patent: Jan. 14, 2025

(54) CERAMIC ELECTRONIC COMPONENT, SUBSTRATE ARRANGEMENT, AND METHOD OF MANUFACTURING CERAMIC ELECTRONIC COMPONENT

(71) Applicant: TAIYO YUDEN CO., LTD., Tokyo (JP)

(72) Inventor: Yasutomo Suga, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 363 days.

(21) Appl. No.: 17/667,431

(22) Filed: Feb. 8, 2022

(65) Prior Publication Data
US 2022/0301778 A1 Sep. 22, 2022

(30) Foreign Application Priority Data

Mar. 16, 2021 (JP) ................................ 2021-042305

(51) Int. Cl.
*H01G 4/20* (2006.01)
*H01G 4/232* (2006.01)
(Continued)

(52) U.S. Cl.
CPC ........... *H01G 4/2325* (2013.01); *H01G 4/248* (2013.01); *H01G 4/30* (2013.01); *H05K 1/181* (2013.01);
(Continued)

(58) Field of Classification Search
CPC .................................................. H01G 4/2325
(Continued)

(56) References Cited

U.S. PATENT DOCUMENTS 6,903,919 B2 * 6/2005 Kayatani ................ H01G 2/103
29/25.42
6,964,884 B1 * 11/2005 Chan ...................... H05K 3/383
438/118

(Continued)

FOREIGN PATENT DOCUMENTS

JP 2008-010885 A 1/2008
JP 2016-178219 A 10/2016
(Continued)

OTHER PUBLICATIONS

Office Action issued Aug. 10, 2023 in U.S. Appl. No. 17/684,555 which has been cross-referenced to the instant application. U.S. Patent document 1 and U.S. Patent Publication documents 1-12 listed above were cited in that Office Action.

(Continued)

*Primary Examiner* — Stanley Tso
(74) *Attorney, Agent, or Firm* — CHEN YOSHIMURA LLP

(57) ABSTRACT

A ceramic electronic component includes an element body having a dielectric and internal electrodes, the element body having an upper surface, a lower surface, and side surfaces; external electrodes formed on multiple surfaces of the element body, and an oxide layer formed on the upper surface of the element body. Each of the external electrodes has a base layer and a plating layer, the base layer containing metal and having a lower part formed on the lower surface of the element body and a side part formed on one of the side surfaces of the element body and being connected to one or more of the internal electrodes, the plating layers being formed on the lower part of the corresponding base layer. The oxide layer has a surface roughness Ra that is equal to or greater than 0.20 micrometers.

20 Claims, 14 Drawing Sheets

(51) Int. Cl.
*H01G 4/248* (2006.01)
*H01G 4/30* (2006.01)
*H05K 1/18* (2006.01)

(52) U.S. Cl.
CPC .............. *H05K 2201/10015* (2013.01); *H05K 2201/10234* (2013.01); *H05K 2201/10636* (2013.01); *H05K 2201/10977* (2013.01)

(58) Field of Classification Search
USPC ........................................................ 174/260
See application file for complete search history.

(56) References Cited

U.S. PATENT DOCUMENTS

| | | | |
|---|---|---|---|
| 9,653,212 B2 | 5/2017 | Lee et al. | |
| 9,758,695 B2 | 9/2017 | Hong et al. | |
| 9,818,510 B2 | 11/2017 | Mori et al. | |
| 9,818,511 B2 | 11/2017 | Mori et al. | |
| 9,978,523 B1 | 5/2018 | Park et al. | |
| 10,186,367 B2 | 1/2019 | Lee et al. | |
| 10,366,834 B1 | 7/2019 | Lee et al. | |
| 10,734,142 B2 | 8/2020 | Mori et al. | |
| 11,158,455 B2 | 10/2021 | Yoon et al. | |
| 11,183,332 B2 | 11/2021 | Kim et al. | |
| 11,342,122 B2 | 5/2022 | Masunari | |
| 11,600,443 B2 | 3/2023 | Kim et al. | |
| 2004/0217445 A1 | 11/2004 | Sakashita et al. | |
| 2007/0076348 A1 | 4/2007 | Shioga et al. | |
| 2009/0008765 A1 | 1/2009 | Yamano et al. | |
| 2010/0232126 A1 | 9/2010 | Maeda et al. | |
| 2010/0290172 A1 | 11/2010 | Motoki et al. | |
| 2010/0302704 A1 | 12/2010 | Ogawa et al. | |
| 2011/0256662 A1 | 10/2011 | Yamano et al. | |
| 2013/0020913 A1* | 1/2013 | Shirakawa ............. H01G 4/232 336/200 |
| 2014/0085767 A1* | 3/2014 | Kang .................... H01G 13/00 361/301.4 |
| 2014/0313681 A1 | 10/2014 | Yamano et al. | |
| 2015/0016014 A1 | 1/2015 | Park et al. | |
| 2015/0084481 A1* | 3/2015 | Mori ....................... H01G 4/252 29/829 |
| 2015/0084487 A1 | 3/2015 | Mori et al. | |
| 2016/0276104 A1 | 9/2016 | Nishisaka et al. | |
| 2016/0358858 A1 | 12/2016 | Yamano et al. | |
| 2017/0256359 A1 | 9/2017 | Masunari | |
| 2017/0365559 A1 | 12/2017 | Yamano et al. | |
| 2017/0367187 A1 | 12/2017 | Chae et al. | |
| 2018/0025844 A1 | 1/2018 | Sato et al. | |
| 2018/0182550 A1 | 6/2018 | Sasaki et al. | |
| 2019/0131076 A1 | 5/2019 | Fukumura | |
| 2019/0341190 A1* | 11/2019 | Lee ....................... H01G 4/2325 |
| 2019/0346641 A1 | 11/2019 | Schlepple et al. | |
| 2019/0385795 A1 | 12/2019 | Yang et al. | |
| 2020/0035417 A1 | 1/2020 | Sakurai et al. | |
| 2020/0066447 A1 | 2/2020 | Murai et al. | |
| 2020/0203072 A1* | 6/2020 | Park ....................... H01G 4/012 |
| 2020/0335279 A1* | 10/2020 | Jiayin .................. C22C 1/0433 |
| 2020/0365326 A1 | 11/2020 | Masunari | |
| 2021/0082622 A1 | 3/2021 | Kim et al. | |
| 2021/0183581 A1 | 6/2021 | Nakano et al. | |
| 2021/0327648 A1 | 10/2021 | Kanzaki et al. | |
| 2022/0068566 A1 | 3/2022 | Ikebe et al. | |
| 2022/0139616 A1 | 5/2022 | Kang et al. | |
| 2022/0172899 A1 | 6/2022 | Lee et al. | |
| 2022/0208456 A1 | 6/2022 | Lee et al. | |
| 2022/0208457 A1 | 6/2022 | Lee et al. | |
| 2022/0301779 A1 | 9/2022 | Take | |
| 2022/0301781 A1 | 9/2022 | Takei | |

FOREIGN PATENT DOCUMENTS

| | | |
|---|---|---|
| JP | 2020-21930 A | 2/2020 |
| JP | 2020-188144 A | 11/2020 |

OTHER PUBLICATIONS

U.S. Appl. No. 17/673,666, filed Feb. 16, 2022.
U.S. Appl. No. 17/684,555, filed Mar. 2, 2022.
Office Action issued May 10, 2023 in U.S. Appl. No. 17/673,666, which has been cross-referenced to the instant application. U.S. Patent documents 1-12 and US Patent Publication documents 1-16 listed above were cited in that Office Action.
Japanese Office Action dated Nov. 19, 2024 in a counterpart Japanese patent application No. 2021-042305 (A machine translation (not reviewed for accuracy) attached.).

* cited by examiner

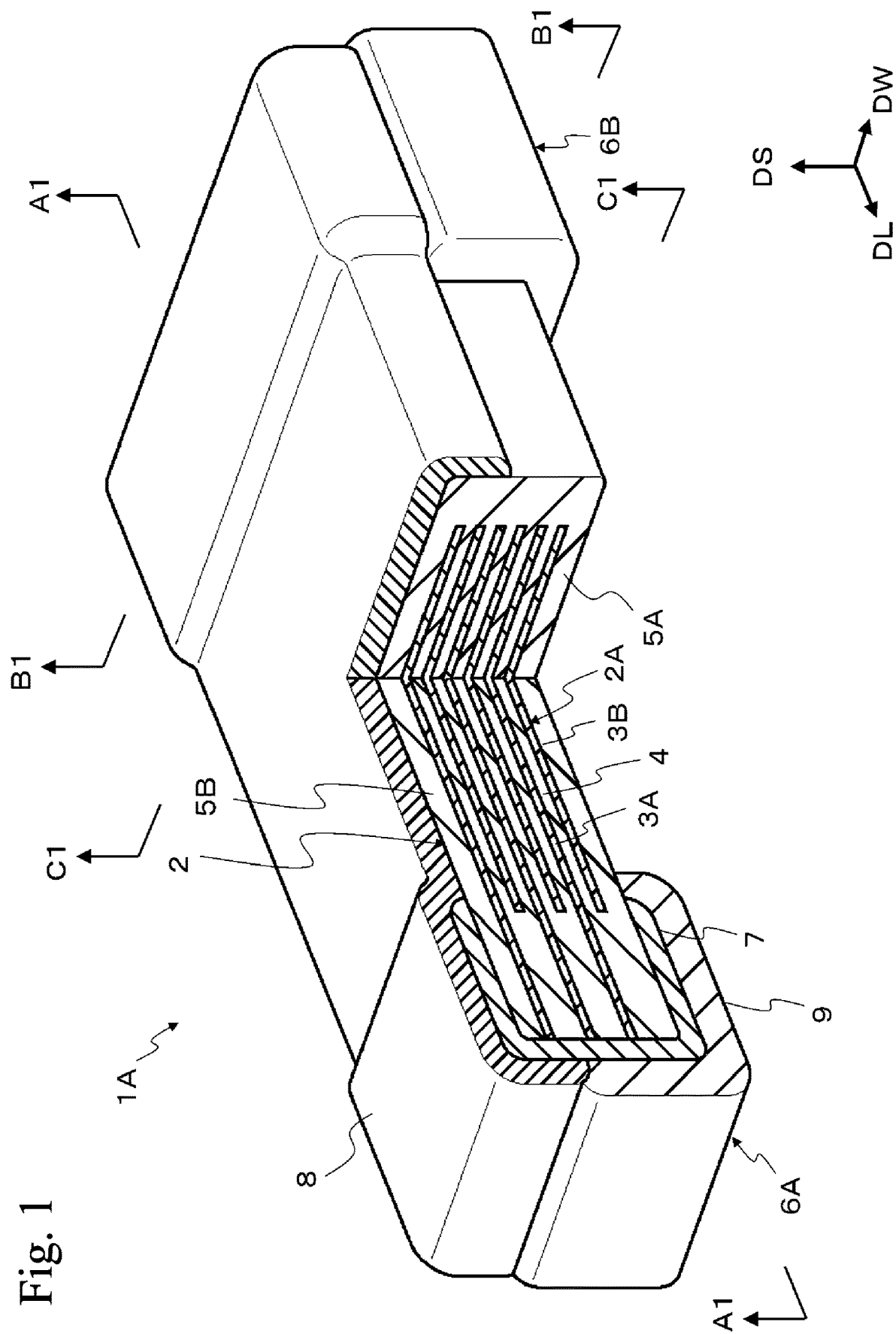

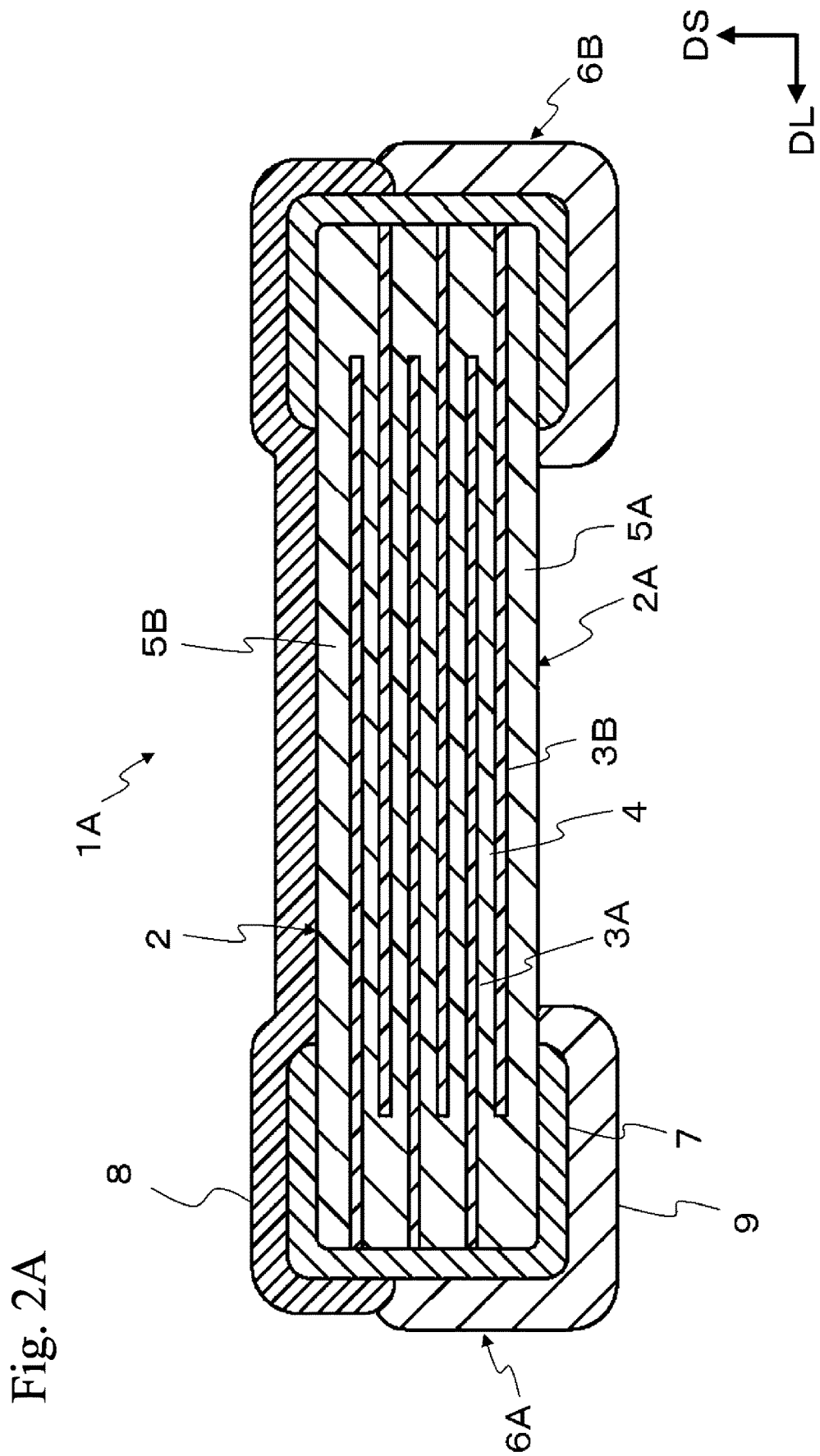

Fig. 10

| | Height of External Electrodes (μm) | Number of Internal Electrodes (μm) | Thickness of Chip (μm) | Thickness of Oxide Layer (μm) | Distance Between Lower Edge of Oxide Layer and Top Surface of Oxide Layer (μm) | Continuity of Oxide Layer | Height After Mounting (μm) |
|---|---|---|---|---|---|---|---|
| Sample 1 | 70 | 12 | 75 | 5 | 35 | Yes | 80.2 |
| Sample 2 | 70 | 12 | 75 | 5 | 20 | Yes | 80.3 |
| Sample 3 | 70 | 12 | 75 | 5 | 15 | Yes | 80.1 |
| Sample 4 | 70 | 12 | 75 | 5 | 10 | Yes | 80.4 |
| Sample 5 | 70 | 12 | 75 | 5 | 7 | Yes | 83.6 |
| Sample 6 | 70 | 12 | 75 | 5 | 3 | Yes | 87.2 |
| Sample 7 | 70 | 12 | 70.5 | 0.5 | 15 | No | 75.8 |
| Sample 8 | 70 | 12 | 71.5 | 1.5 | 15 | Yes | 80.2 |
| Sample 9 | 70 | 12 | 72 | 2.5 | 15 | Yes | 80.2 |
| Sample 10 | 70 | 12 | 75 | 5 | 15 | Yes | 80.2 |
| Sample 11 | 70 | 12 | 80 | 10 | 15 | Yes | 80.2 |
| Sample 12 | 70 | 12 | 85 | 15 | 15 | Yes | 80.2 |
| Comparative Example 1 | 70 | 12 | 70 | 0 | 0 | - | 85.4 |

Fig. 11

| | Surface Roughness Ra (μm) | Ratio of Failues After Moisture Resistance Test |
|---|---|---|
| Comparative Example A | 0.13 | 5/77 |
| Comparative Example B | 0.17 | 2/77 |
| Working Eample C | 0.21 | 0/77 |
| Working Eample D | 0.31 | 0/77 |

CERAMIC ELECTRONIC COMPONENT, SUBSTRATE ARRANGEMENT, AND METHOD OF MANUFACTURING CERAMIC ELECTRONIC COMPONENT

TECHNICAL FIELD

The present invention relates to ceramic electronic components, substrate arrangements, and methods of manufacturing ceramic electronic components.

RELATED ART

In order to improve the reliability of a ceramic electronic component mounted on a substrate, the ceramic electronic component may be sealed with resin. In this case, if adhesion between the ceramic electronic component and the resin cannot be secured, a gap occurs therebetween, and moisture can easily penetrate the gap. As a result, the reliability of the resin-encapsulated ceramic electronic component is reduced, and the characteristics of the ceramic electronic component may deteriorate, and the ceramic electronic component may fail at worst.

Patent Document 1 discloses a multi-layered ceramic electronic component including an element body and terminal electrodes surrounding the element body. Each terminal electrode includes a side part arranged on one side of the element body, and an upper portion extending from the side portion and placed on the upper surface of the element body. In this structure, the lower surface of the element body is not covered with the terminal electrodes.

Patent Document 1: JP-A-2020-21930

SUMMARY OF THE INVENTION

For manufacturing the structure disclosed in Patent Document 1, in order to prevent terminal electrodes from being formed on the lower surface of the element body, a dummy block is brought into contact with the lower surface when the terminal electrodes are formed. In this case, the lower surface of the element body is flattened by the dummy block being pressed against the lower surface of the element body, so that the sealing resin cannot sometimes adheres the lower surface sufficiently.

Accordingly, it is an object of the present invention to provide a ceramic electronic component that can improve the adhesiveness with sealing resin, a substrate arrangement having the ceramic electronic component, and a method of manufacturing the ceramic electronic component.

According to one aspect of the present invention, there is provided a ceramic electronic component including an element body including a dielectric and internal electrodes, the element body having an upper surface, a lower surface, and side surfaces; external electrodes formed on multiple surfaces of the element body, each of the external electrodes including a base layer and a plating layer, the base layer containing metal and having a lower part formed on the lower surface of the element body and a side part formed on one of the side surfaces of the element body and being connected to one or more of the internal electrodes, the plating layer being formed on the lower part of the corresponding base layer; and an oxide layer formed on the upper surface of the element body, the oxide layer having a surface roughness Ra that is equal to or greater than 0.20 micrometers.

The base layer of each of the external electrodes may further include an upper part formed on the upper surface of the element body, and the oxide layer may be formed on the upper parts of the base layers.

The base layers of each of the external electrodes may further include an upper part formed on the upper surface of the element body. The oxide layer may continuously cover the upper surface of the element body and the respective upper parts and the side parts of the base layers of the external electrodes. The plating layer of each of the external electrodes may be formed on the lower part and the side part of the corresponding base layer and may be in contact with the oxide layer on the side part of the base layer. The plating layers of each of the external electrodes may be absent on the upper surface of the element body.

The element body may further have a front surface and a rear surface. The base layer of each of the external electrodes may further include an upper part formed on the upper surface of the element body, a front part formed on the front surface of the element body, and a rear part formed on the rear surface of the element body. The oxide layer may continuously cover the upper surface, the front surface, and the rear surface of the element body, and the upper parts, the side parts, the front parts, and the rear parts of the base layers of the external electrodes. The plating layer of each of the external electrodes may be formed on the lower part, the side part, the front part, and the rear part of the corresponding base layer and may be in contact with the oxide layer on the side part, the front part, and the rear part of the base layer. The plating layer of each of the external electrodes may be absent on the upper surface of the element body.

The oxide layer may further include side parts formed on the respective side parts of the base layers. The plating layer of each of the external electrodes may be absent on an upper surface of the oxide layer, and may cover one of the side parts of the oxide layer.

The oxide layer may further include side parts formed on the respective side parts of the base layers. Each of the side parts of the oxide layer may have a lower edge located in a range having an upper limit and a lower limit, in which the upper limit may be distant at least 10 micrometers from an upper surface of the oxide layer, and the lower limit may be from the upper surface of the oxide layer within a half of a distance between the upper surface of the oxide layer and a lower surface of the external electrode.

A distance between an upper surface of the oxide layer and a lower surface of the external electrode may be 150 micrometers or less.

The oxide layer may have a thickness that is from one micrometer to five micrometers.

The dielectric may be made of a material having a main component, and the oxide layer may be made of a material having a main component that is the same as the main component of the dielectric.

The oxide layer may be made of an oxide ceramic.

The oxide layer may be made of a material containing at least one of barium titanate, strontium titanate, calcium titanate, magnesium titanate, barium strontium titanate, barium calcium titanate, calcium zirconate, barium zirconate, calcium titanate zirconate, titanium oxide, silicon oxide, and aluminum oxide.

The base layer of each of the external electrodes may contain a co-material dispersed in the metal.

The co-material may be an oxide ceramic.

The element body may be a laminate in which first internal electrode layers and second internal electrode layers are alternately stacked with dielectric layers interposed therebetween. The external electrodes include a first external electrode and a second external electrode provided on mutually opposing sides of the laminate. The first internal electrode layers may be connected to the first external electrode, and the second internal electrode layers may be connected to the second external electrode.

According to another aspect of the present invention, there is provided an arrangement including a mounting substrate; and the ceramic electronic component mounted on a surface of the mounting substrate. The ceramic electronic component may be connected to the mounting substrate via solder layers, and the solder layers may be adhered to the plating layers of the external electrodes, respectively. Each of the solder layers may be in surface contact with a side surface of the corresponding plating layer and may be located below an upper surface of the oxide layer.

The arrangement may further include a resin layer that encapsulates the ceramic electronic component on the mounting substrate, so that no gap exists between the resin layer and the oxide layer through which moisture can ingress.

The arrangement may further include solder balls formed on the surface of the mounting substrate, in which the surface may be the same as the surface on which the ceramic electronic component is mounted.

The arrangement may further include another mounting substrate connected electrically with the mounting substrate via the solder balls, in which the ceramic electronic component may be interposed between the mounting substrate and said another mounting substrate.

According to another aspect of the present invention, there is provided a method of manufacturing a ceramic electronic component, the method including forming an element body that includes a dielectric and internal electrodes, the element body having an upper surface, a lower surface, and side surfaces; applying a base material for base layers of external electrodes onto the lower surface and the side surfaces of the element body; applying an oxide material for an oxide layer onto the upper surface of the element body and onto portions of the base material that are on the side surfaces; thereafter, sintering the base material and the oxide material to form the base layers of the external electrodes and the oxide layer, the base layer of each of the external electrodes having a lower part formed on the lower surface of the element body and a side part formed on one of the side surfaces of the element body and being connected to one or more of the internal electrodes, the oxide layer being formed on the upper surface of the element body and on the respective portions of the base layers on the side surfaces, the oxide layer having a surface roughness Ra that is equal to or greater than 0.20 micrometers; and forming plating layers on the base layers, respectively, each of the plating layers being formed on the lower part and the side part of one of the base layers.

Applying the base material onto the lower surface and the side surfaces of the element body may include applying the base material onto the upper surface of the element body, so that after the base material is sintered, each of the base layers further has an upper part formed on the upper surface of the element body. Applying the oxide material onto the upper surface of the element body and on the portions of the base material on the side surfaces may include applying the oxide material onto the base material applied on the upper surface of the element body, so that after the oxide material is sintered, the oxide layer is formed on the respective upper parts and the side parts of the base layers. A thickness of the oxide layer and a location of the oxide layer on the side parts of the base layers may be configured such that when solder layers for mounting the plating layers on a mounting substrate are in surface contact with side surfaces of the plating layers, respectively, the solder layers are located below a topmost surface of the oxide layer.

According to the present invention, the adhesiveness between a ceramic electronic component and sealing resin can be improved.

BRIEF DESCRIPTION OF THE DRAWINGS

FIG. 1 is a perspective view showing a multilayer ceramic capacitor according to a first embodiment of the present invention;

FIG. 2A is a cross-sectional view of the multilayer ceramic capacitor taken along line A1-A1 in FIG. 1;

FIG. 10 is a table showing a relationship among the thickness of an oxide layer, the position of the lower edge of the oxide layer, and the height of multilayer ceramic capacitors of FIG. 6A after mounting; and FIG. 11 is a table showing the moisture resistance of the multilayer ceramic capacitor of FIG. 6A after resin encapsulation compared to that of the multilayer ceramic capacitor of FIG. 6B after resin encapsulation.

DESCRIPTION OF EMBODIMENTS

Figure 2B:
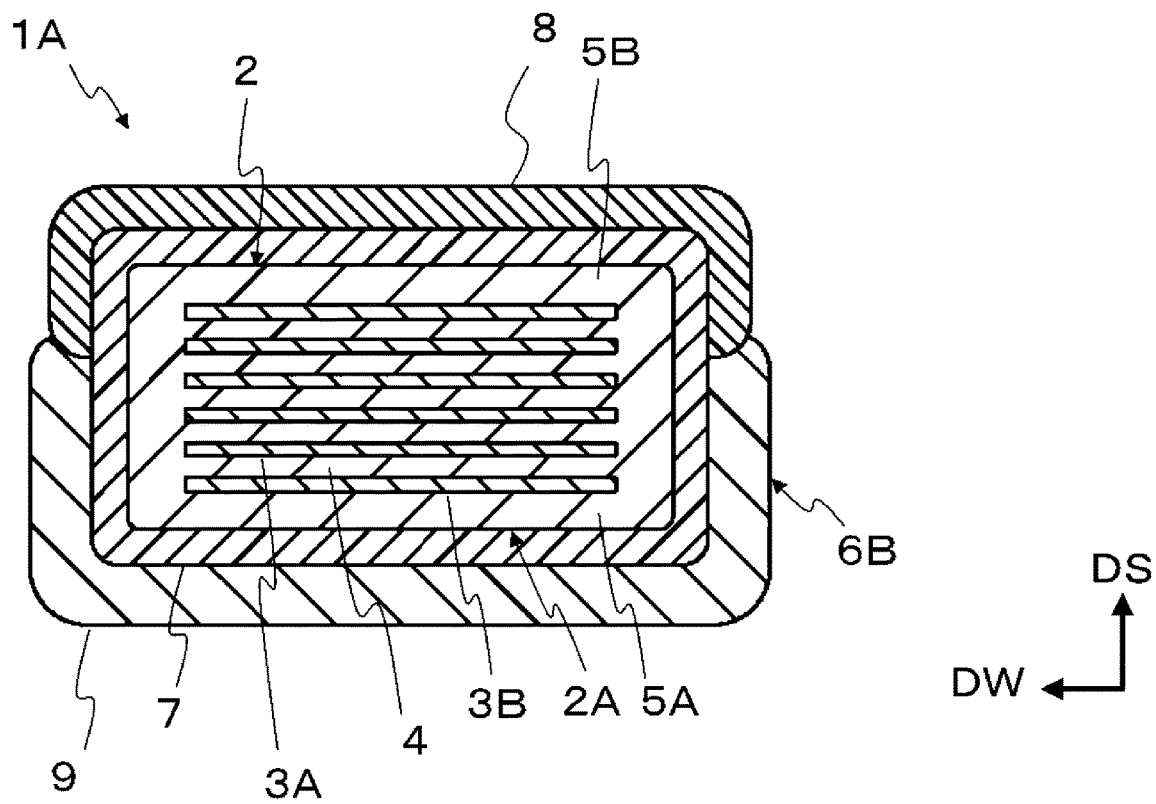
FIG. 2B is a cross-sectional view of the multilayer ceramic capacitor taken along line B1-B1 in FIG. 1.

Embodiments of the present invention will now be described with reference to the accompanying drawings. The following embodiments are not intended to limit the present invention. The combination of all the features described in each of the embodiments is not absolutely necessary for the present invention. The configuration of each embodiment may be modified and/or changed depending upon designs, specifications, and various conditions of an apparatus and a device to which the present invention is applied (use conditions, use environment, and the like). The technical scope of the invention is defined by the appended claims and is not limited by the following embodiments. Furthermore, parts, components, and elements shown in the drawings used in connection with the following description may be different from actual parts, components, and elements in the structure, scale, and shape for the sake of easier understanding of the parts, components, and elements.

First Embodiment

Figure 2C:
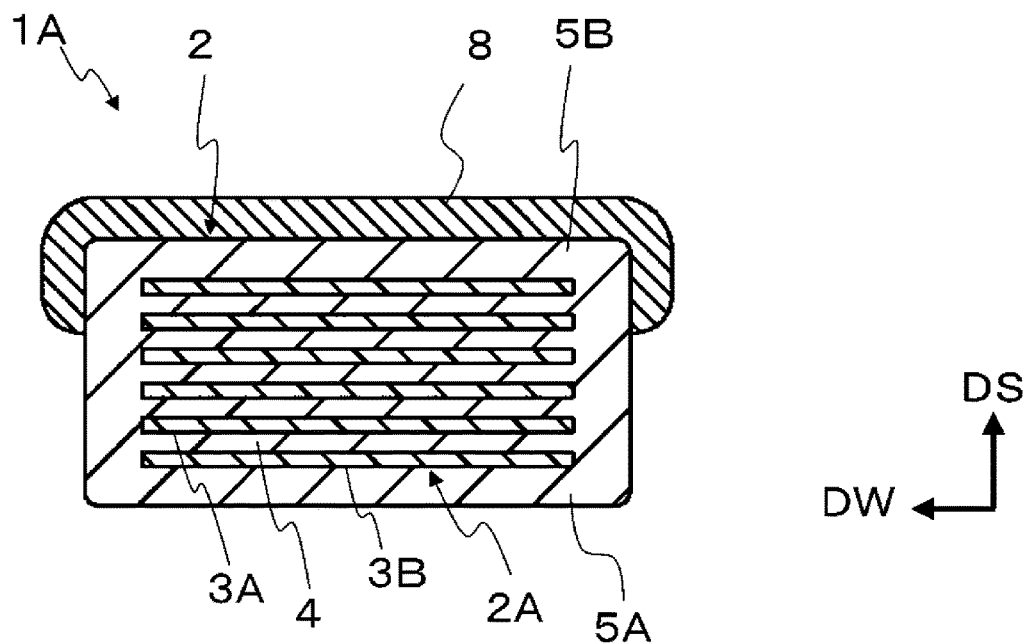
FIG. 2C is a cross-sectional view of the multilayer ceramic capacitor taken along line C1-C1 in FIG. 1.

FIG. 1 is a perspective view showing a multilayer ceramic capacitor according to a first embodiment of the present invention. FIG. 2A is a cross-sectional view of the multilayer ceramic capacitor taken along line A1-A1 in FIG. 1. FIG. 2B is a cross-sectional view of the multilayer ceramic capacitor taken along line B1-B1 in FIG. 1. FIG. 2C is a cross-sectional view of the multilayer ceramic capacitor taken along line C1-C1 in FIG. 1.

In this embodiment, a multilayer ceramic capacitor is taken as an example as a ceramic electronic component.

As shown in FIGS. 1 and 2A to 2C, the multilayer ceramic capacitor 1A includes an element body (element assembly) 2, external electrodes (outer electrodes) 6A and 6B, and an oxide layer 8. The element body 2 has a laminate (or stack) 2A, a lower cover layer 5A, and an upper cover layer 5B. The laminate 2A has internal electrode layers (inner electrode layers) 3A, other internal electrode layers 3B, and dielectric layers 4 interposed between neighboring internal electrode layers 3A and 3B.

The lowermost layer of the laminate 2A is covered with the lower cover layer 5A, and the uppermost layer of the laminate 2A is covered with the upper cover layer 5B. The internal electrode layers 3A and 3B are alternately stacked in such a manner that the dielectric layers 4 are interposed therebetween. Although FIGS. 1 and 2A to 2C show an example in which six internal electrode layers 3A and 3B are stacked in total, the number of stacked internal electrode layers 3A and 3B is not limited. The shape of the element body 2 may be a substantially rectangular parallelepiped shape, and the shape of the laminate 2A may also be a substantially rectangular parallelepiped shape. The element body 2 may be chamfered along the respective edges of the element body 2.

In the following description, the direction perpendicularly passing through the two side surfaces of the element body 2 may be referred to as a longitudinal direction DL, the direction perpendicularly passing through the front and rear surfaces of the element body 2 may be referred to as a width direction DW, and the direction perpendicularly passing through the top and bottom surfaces of the element body 2 may be referred to as a stacking direction (height direction) DS.

The external electrodes 6A and 6B are located on opposite sides of the element body 2, respectively, so that the external electrodes 6A and 6B are spaced apart (separated) from each other. Each of the external electrodes 6A and 6B continuously covers the top surface, the side surface, and the bottom surface of the element body 2. Each of the external electrodes 6A and 6B may also cover the front surface and the rear surface of the element body 2. The lower surface of each of the external electrodes 6A and 6B faces a mounting substrate on which the multilayer ceramic capacitor 1A is mounted.

In the longitudinal direction DL, the internal electrode layers 3A and 3B are arranged alternately at different positions in the laminate 2A. The internal electrode layers 3A can be closer to the left side surface of the element body 2 than the internal electrode layers 3B, whereas the internal electrode layers 3B can be closer to the right side surface of the element body 2 than the internal electrode layers 3A. Left ends of the internal electrode layers 3A are exposed at the left ends of the dielectric layers 4 and at the left side surface in the longitudinal direction DL of the element body 2 and are connected to the external electrode 6A. Right ends of the internal electrode layers 3B are exposed at the right ends of the dielectric layers 4 and at the right side surface in the longitudinal direction DL of the element body 2 and are connected to the external electrode 6B.

On the other hand, in the width direction DW, which is perpendicular to the longitudinal direction DL perpendicularly passing through the two side surfaces of the element body 2, ends of the internal electrode layers 3A and 3B are covered with the dielectric material that forms the dielectric layers 4. In the width direction DW, both ends of the internal electrode layers 3A may be aligned with both ends of the internal electrode layers 3B.

The thickness of each of the internal electrode layers 3A, the internal electrode layers 3B, and the dielectric layers 4 in the stacking direction DS may be in a range from 0.05 micrometers to five micrometers, for example, may be 0.3 micrometers.

The material of the internal electrode layers 3A and 3B may be a metal, for example, Cu (copper), Ni (nickel), Ti (titanium), Ag (silver), Au (gold), Pt (platinum), Pd (palladium), Ta (tantalum), or W (tungsten), or may be an alloy containing at least one of the metals.

The main component of the material of the dielectric layers 4 may be, for example, a ceramic material having a perovskite structure. The main component may be contained in a ratio of 50 at % or more. The ceramic material of the dielectric layers 4 may be, for example, barium titanate, strontium titanate, calcium titanate, magnesium titanate, barium strontium titanate, barium calcium titanate, calcium zirconate, barium zirconate, calcium titanate zirconate, or titanium oxide.

The main component of the material of the lower cover layer 5A and the upper cover layer 5B may be, for example, a ceramic material. The main component of the ceramic material of the lower cover layer 5A and the upper cover layer 5B may be the same as the main component of the ceramic material of the dielectric layers 4.

Each of the external electrodes 6A and 6B has a base layer 7 formed on the element body 2 and a plating layer 9 formed on the base layer 7.

Each of the base layers 7 is continuously formed so as to have an upper part formed on the upper surface of the element body 2, a lower part formed on the lower surface of the element body 2, a side part formed on a side surface of the element body 2, a front part formed on the front surface of the element body 2, and a rear part formed on the rear surface of the element body 2.

Each of the plating layer 9 is continuously formed so as to be placed on the lower part and a lower portion of the side part of one of the base layers 7. Each of the plating layer 9 may be continuously formed so as to be placed on a lower portion of the front part and a lower portion of the rear part of one of the base layers 7. Accordingly, the lower part, a lower portion of the side part, a lower portion of the front part, and a lower portion of the rear part of the base layer 7 are covered with the plating layer 9, but the upper part, an upper portion of the side part, an upper portion of the front part, and an upper portion of the rear part of the base layer 7 are not covered with the plating layer 9.

The lower part of each of the external electrodes 6A and 6B has a thickness of, for example, 10 to 40 micrometers.

The electrical conductive material of the base layer 7 may be a metal, for example, Cu, Fe (iron), Zn (zinc), Al (aluminum), Ni, Pt, Pd, Ag, Au, and Sn (tin), or may be an alloy containing at least one of the metals. The base layer 7 may further include co-material particles dispersed in the metal. Here, the term "particle" is meant to include not only an individual small particle, but also a block formed by a combination of multiple small particles after the sintering process, which will be described later. The co-material dispersed like islands in the base layer 7 reduces the difference in thermal expansion coefficients of the element body 2 and the base layer 7 to alleviate thermal stress exerted in the base layer 7. The co-material is, for example, a ceramic component that is the main component of the material of the dielectric layers 4. The base layer 7 may also include a glass component. The glass component in the base layer 7 can densify the base layer 7. The glass component may be, for example, an oxide of Ba (barium), Sr (strontium), Ca (calcium), Zn, Al, Si (silicon), B (boron), or the like.

The base layer 7 may contain a metal component contained in the element body 2. This metal component may be, for example, Mg (magnesium), but may contain a small amount of at least one of Ni, Cr, Sr, Al, Na, and Fe. More specifically, the base layer 7 may be a compound of the metal used as the conductive material of the base layer 7 and the metal and oxygen contained in the element body 2, for example, a compound containing Mg, Ni, and O.

The main component of the material of the plating layer 9 may be a metal, for example, Cu, Ni, Al, Zn, Sn, or the like, or may be an alloy containing at least one of the metals. The plating layer 9 may be a single layer of a single metal component or multiple layers of different metal components.

Each of the plating layers 9 may have a three-layered structure consisting of, for example, a Cu plating layer formed on the base layer 7, a Ni plating layer formed on the Cu plating layer, and a Sn plating layer formed on the Ni plating layer. The Cu plating layer can improve the adhesiveness of the plating layer 9 to the base layer 7, and the Ni plating layer can improve the heat resistance of the external electrode 6A and 6B during soldering. The Sn plating layer can improve the wettability of the solder for the plating layer 9.

Each of the plating layers 9 is formed on a part of the base layer 7 and is electrically connected with the internal electrode layer 3A or 3B. In addition, each of the plating layers 9 is electrically connected with an electrode on a mounting board through solder.

An oxide layer 8 is formed on the upper surface (on the opposite side of the mounting surface) of the element body 2. The surface roughness Ra (arithmetic average roughness) of the oxide layer 8 may be equal to or greater than 0.20 micrometers. The surface roughness of the oxide layer 8 is preferably greater than those of the element body 2 and of the base layer 7. As a result, when sealing resin is bonded to the element body 2, the base layer 7, and oxide layer 8, the actual contact area between the oxide layer 8 and the resin is greater than that between the element body 2 and the resin and is greater than that between the base layer 7 and the resin. Accordingly, when sealing resin is bonded to the element body 2, the base layer 7, and oxide layer 8, the adhesive strength between the oxide layer 8 and the resin is greater than that between the element body 2 and the resin and is greater than that between the base layer 7 and the resin.

The oxide layer 8 is formed continuously to be placed on the upper surface of the element body 2 and on the upper parts and the side parts of the base layers 7 of the external electrodes 6A and 6B. On the other hand, each of the plating layers 9 is formed on the lower part and the side part of one of the base layers 7.

Each of the side parts of the oxide layer 8 has a lower edge located in a range having an upper limit and a lower limit. The upper limit is distant at least 10 micrometers from the upper surface of the oxide layer 8, whereas the lower limit is from the upper surface of the oxide layer 8 within a half of the height of the multilayer ceramic capacitor 1A (the distance between the upper surface of the oxide layer 8 and the lower surfaces of the external electrodes 6A and 6B).

Each of the plating layer 9 covers and is in contact with the lower edge of the oxide layer 8 on the side part of the base layer 7. The lower edge of the oxide layer 8 may be pinched between the base layer 7 and the plating layer 9.

The oxide layer 8 may be formed continuously to be placed on not only the upper surface of the element body 2, but also on the front surface and the rear surface of the element body 2 and on the upper parts, the side parts, the front parts, and the rear parts of the base layers 7 of the external electrodes 6A and 6B. Each of the plating layers 9 may be formed on the lower part, the side part, the front part, and the rear part of one of the base layers 7 and is in contact with the oxide layer 8 on the side part, the front part, and the rear part of the base layer 7.

The oxide layer 8 may have a main component that is the same as that of the dielectric layer 4. For example, the material of the oxide layer 8 may be an oxide ceramic. The thickness of the oxide layer 8 is preferably from one micrometer to five micrometers.

The external dimensions of an example of the multilayer ceramic capacitor 1A may be as follows: the length>the width>the height, or the length>the width=the height. To reduce the height of the multilayer ceramic capacitor 1A, the height of the multilayer ceramic capacitor 1A is preferably 150 micrometers or less. The height of the multilayer ceramic capacitor 1A can be referred to as the thickness of the multilayer ceramic capacitor 1A (the distance from the lower surfaces of the external electrodes 6A and 6B to the upper surface of the oxide layer 8).

In a case in which the surface roughness Ra of the oxide layer 8 is equal to or greater than 0.20 micrometers, when the multilayer ceramic capacitor 1A is sealed with resin, the adhesiveness between the oxide layer 8 and the sealing resin can be improved. As a result, it is possible to prevent occurrence of a gap through which moisture can ingress between the multilayer ceramic capacitor 1A and the sealing resin, and to improve the reliability of the resin-encapsulated multilayer ceramic capacitor 1A.

In addition, by setting the height of the multilayer ceramic capacitor 1A to 150 micrometers or less, the height of the multilayer ceramic capacitor 1A can be made less than the diameter of solder balls, which will be described later. Accordingly, a mounting substrate on which the multilayer ceramic capacitor 1A is mounted can be bonded to another substrate, e.g., a mother board via solder balls in such a manner that the multilayer ceramic capacitor 1A is interposed between the two substrates. As a result, a semiconductor chip can be mounted on the surface of the mounting substrate opposite to the surface on which the multilayer ceramic capacitor 1A is mounted, so that the multilayer ceramic capacitor 1A can be arranged in close proximity to the semiconductor chip, thereby effectively eliminating noise affecting the semiconductor chip.

In addition, by forming the oxide layer 8 on the upper parts and the upper portions of the side parts of the base layer 7, it is possible to prevent the plating layer 9 from being formed on the upper parts and the upper portions of the side parts of the base layer 7. Accordingly, when the multilayer ceramic capacitor 1A is mounted to a substrate with use of solder, it is possible to prevent solder from wetting up to protrude beyond the upper surface of the multilayer ceramic capacitor 1A through the plating layer 9. This makes it possible to prevent the height of the multilayer ceramic capacitor 1A from increasing after mounting on the substrate.

In addition, by making the thickness of the oxide layer 8 between one micrometer and five micrometers, it is possible to ensure the continuity of the oxide layer 8 while preventing the increase in the height of the multilayer ceramic capacitor 1A. Accordingly, when the multilayer ceramic capacitor 1A is mounted to a substrate with use of solder, it is possible to prevent solder from wetting up to the upper surface of the multilayer ceramic capacitor 1A through the plating layer 9. This makes it possible to prevent the height of the multilayer ceramic capacitor 1A from increasing after mounting on the substrate.

In addition, by defining the lower limit of the lower edge of the oxide layer 8 on the side surface of the base layer 7 to within a half of the height of the multilayer ceramic capacitor 1A from the top surface of the oxide layer 8, it is possible to limit the area not covered with the solder layers when mounting the multilayer ceramic capacitor 1A to a mounting substrate. In this way, it is possible to improve the adhesion strength of the external electrodes 6A and 6B to the mounting substrate.

In addition, by defining the upper limit of the lower edge of the oxide layer 8 on the side surface of the base layer 7 to be distant at least 10 micrometers from the top surface of the oxide layer 8, even if solder wets up the side surface of the external electrodes 6A and 6B when the multilayer ceramic capacitor 1A is mounted to a mounting substrate, it is possible to prevent the solder from protruding beyond the top surface of the oxide layer 8. This makes it possible to prevent the height of the multilayer ceramic capacitor 1A from increasing after mounting on the substrate.

In addition, in a case in which the oxide layer 8 has a main component that is the same as the dielectric layer 4, the stress exerted on the oxide layer 8 can be alleviated when the oxide layer 8 is fabricated by sintering, and the adhesiveness between the oxide layer 8 and the element body 2 and between the oxide layer 8 and the base layers 7.

Figure 3:
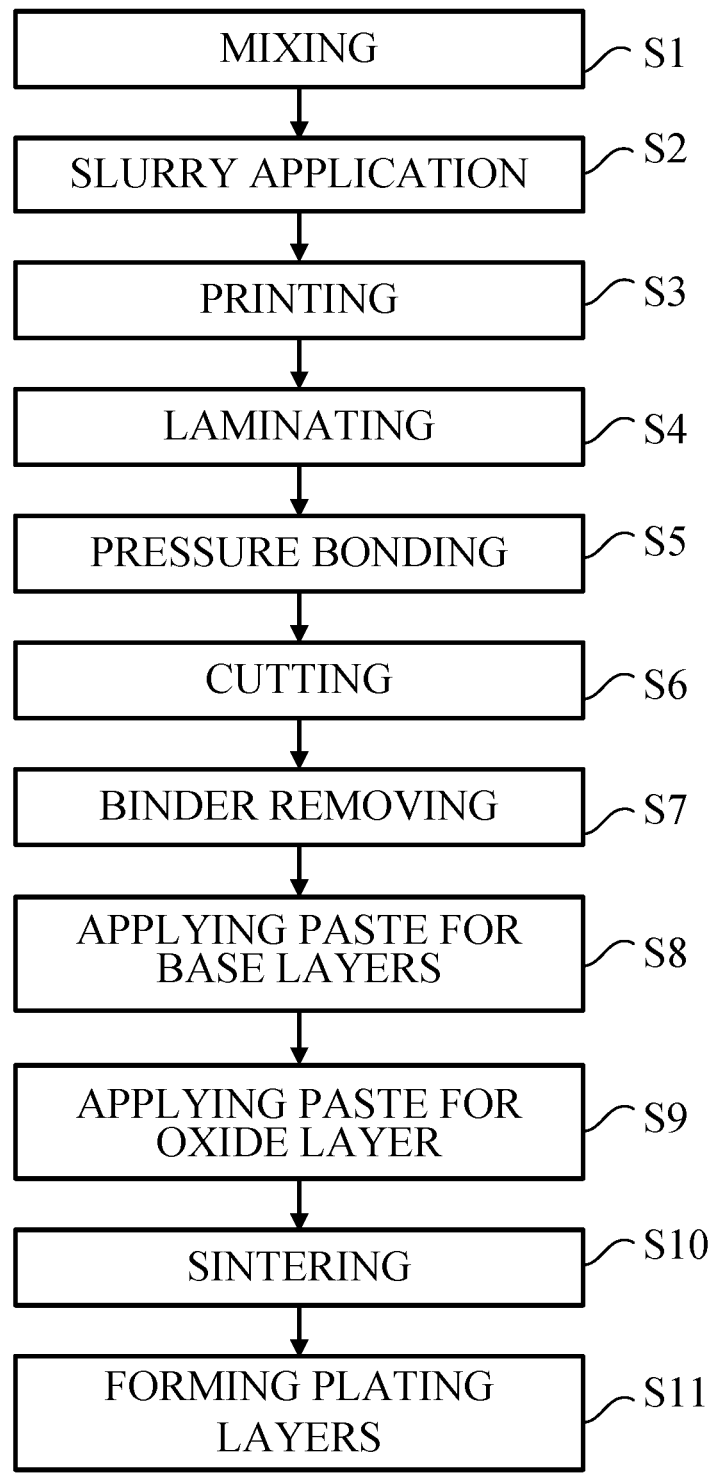
FIG. 3 is a flowchart showing a method of manufacturing a multilayer ceramic capacitor according to the first embodiment.

FIG. 3 is a flowchart showing a method of manufacturing a multilayer ceramic capacitor according to the first embodiment. FIGS. 4A to 4J are cross-sectional views showing an exemplary method of manufacturing the multilayer ceramic capacitor according to the first embodiment. For the sake of illustration, FIG. 4C to FIG. 4J show only three internal electrode layers 3A and three internal electrode layers 3B laminated alternately in such a manner that the dielectric layers 4 are interposed therebetween.

In Step S1 of FIG. 3 (mixing step), an organic binder and an organic solvent, as a dispersant and a forming aid, are added to a dielectric material powder, and pulverized and mixed to produce a muddy slurry. The dielectric material powder includes, for example, a ceramic powder. The dielectric material powder may include an additive or additives. The additive(s) may be, for example, Mg, Mn, V, Cr, Y, Sm, Eu, Gd, Tb, Dy, Ho, Er, Tm, Yb, Co, Ni, Li, B, Na, K or Si oxide, or glass. The organic binder is, for example, a polyvinyl butyral resin or a polyvinyl acetal resin. The organic solvent is, for example, ethanol or toluene.

Figure 4A:
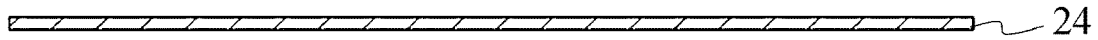
FIGS. 4A to 4J are cross-sectional views used for describing the method of manufacturing the multilayer ceramic capacitor according to the first embodiment.

Next, in Step S2 of FIG. 3 (slurry application step), as shown in FIG. 4A, a green sheet 24 is manufactured. Specifically, the slurry containing the ceramic powder is applied onto a carrier film in a sheet form and dried to manufacture the green sheet 24. The carrier film is, for example, a PET (polyethylene terephthalate) film. The application of the slurry can be conducted with the use of, for example, a doctor blade method, a die coater method, or a gravure coater method. Step S2 is repeated to prepare a plurality of green sheets 24.

Figure 4B:
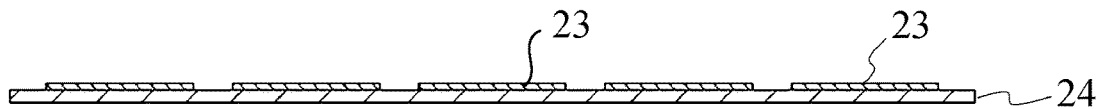

Next, in Step S3 of FIG. 3 (printing step), as shown in FIG. 4B, a conductive paste, which will become an internal electrode layer, is applied in a predetermined pattern onto each of the green sheets 24, on which internal electrode layers 3A or 3B shown in FIG. 1 are to be placed, among the green sheets prepared in Step S1 to form internal electrode patterns 23 on the green sheets 24. In Step S3, it is possible to form a plurality of internal electrode patterns 23 on each single green sheet 24 such that the internal electrode patterns 23 are separated from each other in the longitudinal direction of the green sheet 24.

The conductive paste for the internal electrode layers includes a powder of the metal used as the material of the internal electrode layers 3A and 3B. For example, if the metal used as the material of the internal electrode layers 3A and 3B is Ni, the conductive paste for the internal electrode layers includes a powder of Ni. The conductive paste for the internal electrode layers also includes a binder, a solvent, and, if necessary, an auxiliary agent. The conductive paste for the internal electrode layers may include, as a co-material, a ceramic material having a main component that has the same composition as that of the main component of the material of the dielectric layers 4.

The application of the conductive paste for the internal electrode layers may be conducted with the use of a screen-printing method, an inkjet printing method, or a gravure printing method. Thus, Step S3 may be referred to as a printing step. In this manner, a plurality of green sheets 24 that have the internal electrode patterns 23 thereon are prepared.

Figure 4C:
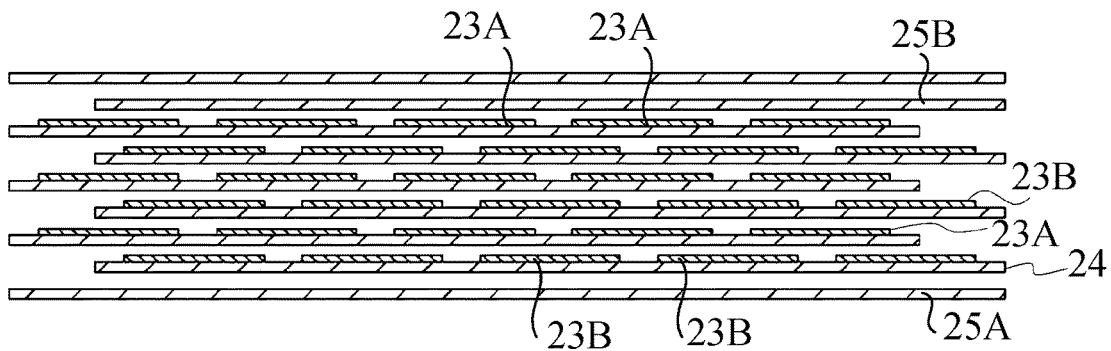

Next, in Step S4 of FIG. 3 (laminating step), as shown in FIG. 4C, the green sheets 24 on which the internal electrode patterns 23 are formed and the green sheets 25A and 25B on which the internal electrode patterns 23 are not formed are laminated in a predetermined order to create a block 30 of the green sheets. The green sheets 25A and 25B on which the internal electrode patterns 23 are not formed are used as the outer layers (the lower cover layer 5A and the upper cover layer 5B).

The green sheets 24 having the internal electrode patterns 23A or 23B thereon are classified into two groups, i.e., the green sheets 24 having the internal electrode patterns 23A (which will form the internal electrode layer 3A) thereon and the green sheets 24 having the internal electrode patterns 23B (which will form the internal electrode layer 3B) thereon. The green sheets 24 having the internal electrode patterns 23A thereon and the green sheets 24 having the internal electrode patterns 23B thereon are stacked alternately in the laminating direction such that the internal electrode patterns 23A on the green sheet 24 and the internal electrode patterns 23B on the next or adjacent green sheet 24 are alternately shifted in the longitudinal direction of the green sheet 24.

Furthermore, three types of portions are defined in the green sheet block 30. Specifically, the green sheet block 30 includes a portion in which only the internal electrode patterns 23A are stacked in the stacking direction, a portion in which the internal electrode patterns 23A and 23B are stacked alternately in the stacking direction, and a portion in which only the internal electrode patterns 23B are stacked in the stacking direction.

Figure 4D:
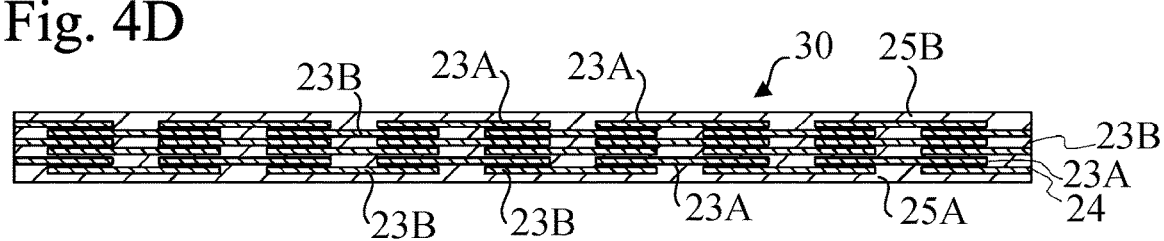

Next, in Step S5 of FIG. 3 (pressure bonding step), as shown in FIG. 4D, the laminate block 30 obtained in the laminating step of Step S4 of FIG. 3 is pressed such that the green sheets 24, 25A, and 25B are pressure-bonded. Pressing the laminate block 30 may be conducted by, for example, hydrostatically pressing the laminate block 30, which may be surrounded by a resin film.

Figure 4E:
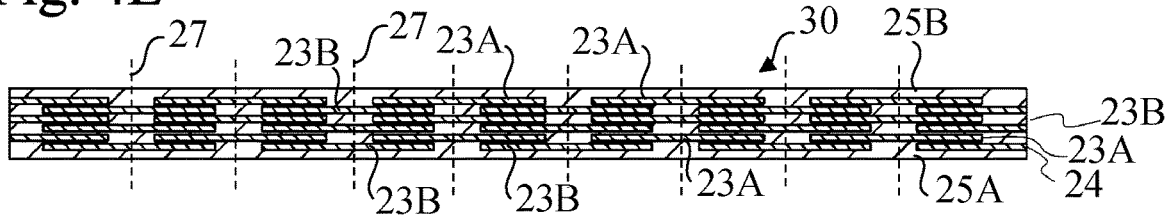

In Step S6 of FIG. 3 (cutting step), as shown in FIG. 4E, the pressed laminate block 30 is cut such that the block 30 is separated into a plurality of element bodies, each of which has a rectangular parallelepiped shape. Each element body has six surfaces. The cutting of the laminate block 30 is conducted at the portions in which only the internal electrode patterns 23A are stacked in the stacking direction, and the portions in which only the internal electrode patterns 23B are stacked in the stacking direction, as indicated by a plurality of vertical broken lines 27. The cutting of the laminate block 30 may be conducted by, for example, blade dicing or a similar method. The resulting element bodies 2 are shown in FIG. 4F.

Figure 4F:
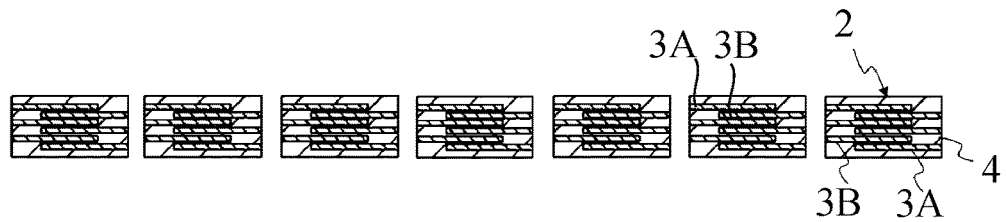

As illustrated in FIG. 4F, the internal electrode layers 3A and 3B are alternately laminated in such a manner that the dielectric layers 4 are interposed therebetween in each of the individual element bodies 2. The internal electrode layers 3A are exposed on one side surface of each element body 2, and the internal electrode layers 3B are exposed on the other side surface of each element body 2.

Next, in Step S7 of FIG. 3 (binder removing step), the binder contained in each of the element bodies 2 separated in Step S6 of FIG. 3 is removed. The removal of the binder is conducted by, for example, heating the element bodies 2 in an $N_2$ atmosphere at about 350 degrees Celsius.

Figure 4G:
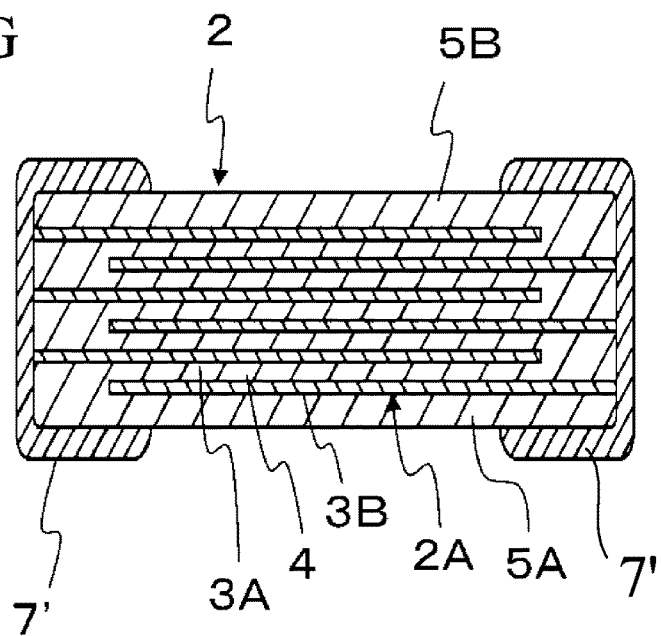

Next, in Step S8 of FIG. 3 (step of applying a paste for the base layers), as shown in FIG. 4G, a conductive paste 7' for the base layers (underlayers) 7 is applied to both side surfaces of each element body 2 from which the binder is removed in Step S7 of FIG. 3 and is applied to the remaining four surfaces (upper, lower, front, and rear surfaces) of the element body 2, which are adjacent to the respective side surfaces. For example, a dipping method can be used to apply the conductive paste 7' for the base layers. Then, the conductive paste 7' is dried.

The conductive paste 7' for the base layers 7 includes a powder or filler of the metal used as the conductive material of the base layers 7. For example, when the metal used as the conductive material 7' of the base layers 7 is Ni, the conductive paste for the base layers includes a powder or filler of Ni. The conductive paste 7' for the base layers also includes, as the co-material, a ceramic component, which is the main component of the material of the dielectric layers 4, for example. Particles of oxide ceramics mainly composed of barium titanate (0.8 micrometers to 4 micrometers in D50 particle diameter), for example, are mixed in the conductive paste 7' for the base layers, as the co-material. The conductive paste 7' for the base layers further includes a binder and a solvent.

Figure 4H:
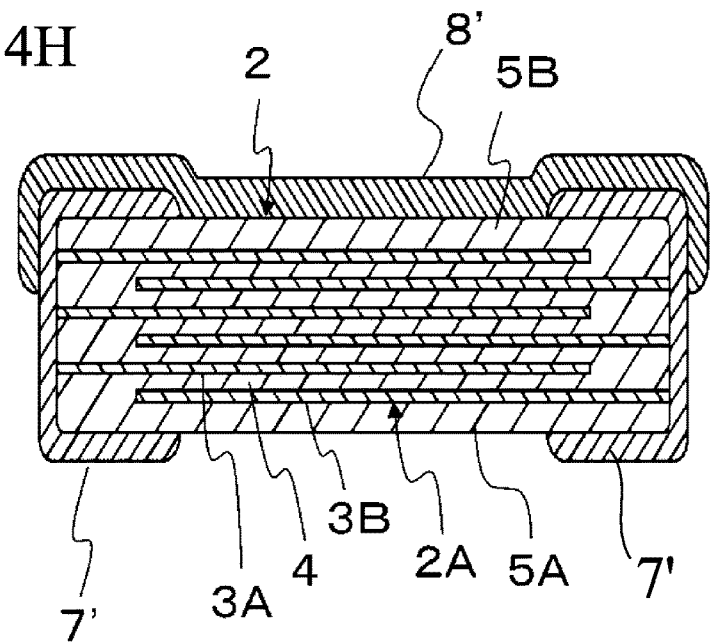

Next, in Step S9 of FIG. 3 (step of applying a paste for the oxide layer), as shown in FIG. 4H, an oxide paste 8' for the oxide layer 8 is applied to the upper surface of the conductive paste 7' for the base layer and the upper surface of the element body 2. In this case, the oxide paste 8' is continuously applied to the top surface, the side surfaces, the front surface, and the rear surface of the conductive paste 7' for the base layer, and is continuously applied to the top surface, the front surface, and the rear surface of the element body 2. Then, the oxide paste 8' is dried.

The oxide paste 8' includes a powder or filler of an oxide used in the oxide layer 8. For example, the oxide paste 8' includes a ceramic component that is the main component of the dielectric layer 4. For example, particles of an oxide ceramic of which the main component is barium titanate are mixed in the oxide paste 8'. In addition to or in place of barium titanate, the oxide that may contained in the oxide paste 8' may also be silicon oxide or aluminum oxide. The oxide paste 8' also includes a binder and a solvent.

For example, a dip method can be used to apply the oxide paste 8'. In this case, the depth of dipping the element body 2 into the oxide paste 8' is adjusted so that each of the side parts of the oxide layer 8 has the lower edge located in the aforementioned range.

In addition, the amount of the oxide contained in the oxide paste 8' is adjusted so that the surface roughness Ra of the oxide layer 8 after sintering the oxide paste 8' is equal to or greater than 0.20 micrometers, and the oxide layer 8 has a thickness of one micrometer to five micrometers. In order to adjust the surface roughness of the oxide layer 8 after sintering of the oxide paste 8', not only the amount contained in the oxide paste 8', but also the diameter or shape of the oxide particles contained in the oxide paste 8' may be adjusted. In addition, in order to adjust the surface roughness of the oxide layer 8 after sintering of the oxide paste 8', the drying speed, drying temperature, and drying time of the oxide paste 8' may be adjusted.

Figure 4I:
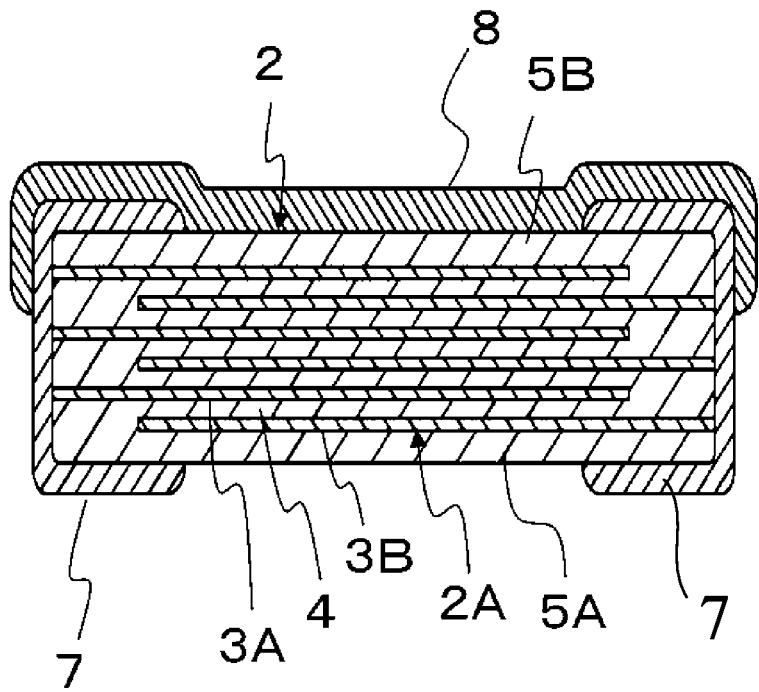

Next, in Step S10 of FIG. 3 (sintering step), as shown in FIG. 4I, the element bodies 2, on which the conductive paste 7' for the base layers 7 and the oxide paste 8' for the oxide layer 8 were applied in Step S9 of FIG. 3, undergo the sintering process such that the internal electrode layers 3A and 3B are integrated with the dielectric layers 4 in each element body 2 and the base layers 7 and the oxide layer 8 are cured and integrated with the element body 2. The sintering of the element bodies 2 is conducted in, for example, a sintering furnace in a temperature range from 1000 degrees Celsius to 1400 degrees Celsius for ten minutes to two hours.

If a base metal such as Ni or Cu is used as the material of the internal electrode layers 3A and 3B, the sintering process may be conducted in the sintering furnace while the interior of the sintering furnace is kept to a reducing atmosphere in order to prevent oxidation of the internal electrode layers 3A and 3B.

After sintering, the surface of the oxide layer 8 may be ground and/or polished to adjust the surface roughness and the thickness of the oxide layer 8.

Figure 4J:
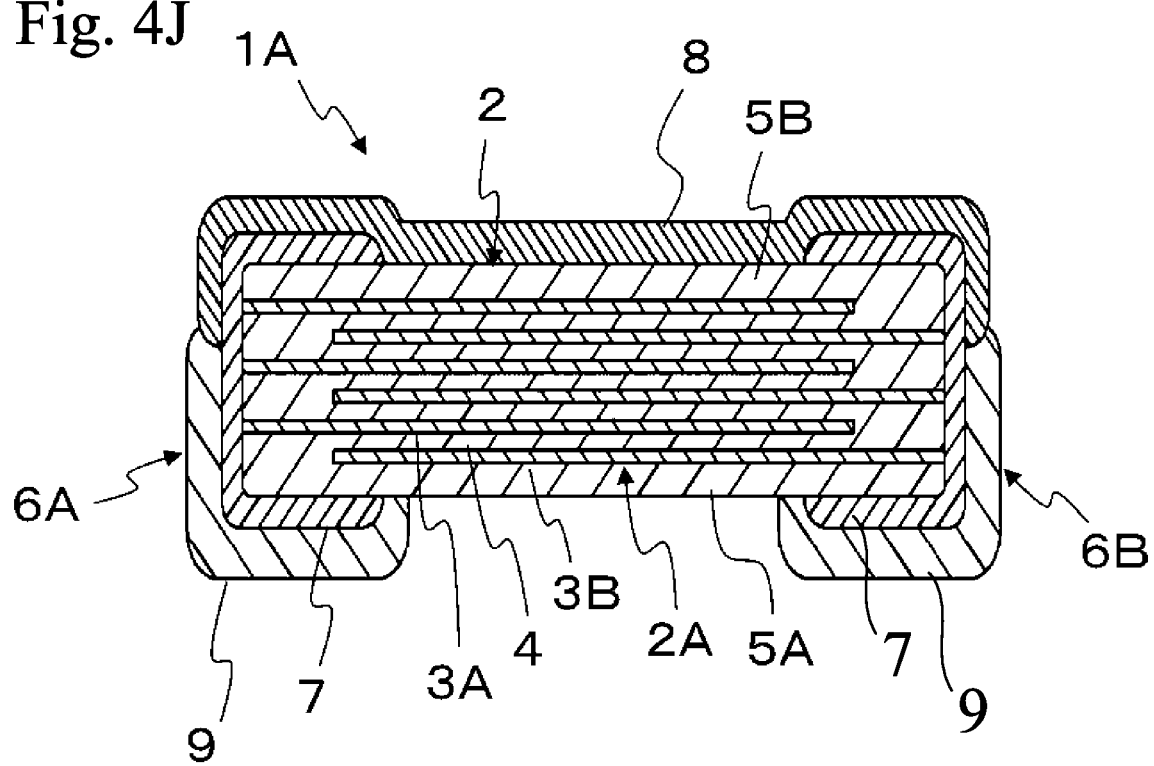

Next, in Step S11 of FIG. 3 (step of forming the plating layers), as shown in FIG. 4J, the plating layers 9 are formed on the base layers 7. In forming the plating layer 9, for example, the Cu plating layer, the Ni plating layer, and the Sn plating layer may be formed sequentially. In this case, the plating layers can be formed by that the element body 2, on which the base layers 7 and the oxide layer 8 are formed, is housed in a barrel and immersed in a plating solution in the barrel, and the barrel is rotated and energized. Since there is the oxide layer 8 on the upper surfaces of the base layers 7, the plating layers 9 are not formed on the upper surfaces of the base layers 7.

By applying the oxide paste 8' to the element body 2 and the base layer 7 using the dip method, the thickness of the oxide layer 8, the thickness, the region, and surface roughness Ra of the oxide layer 8 can be made appropriately while reducing the increase in the number of processes.

Second Embodiment

Figure 5:
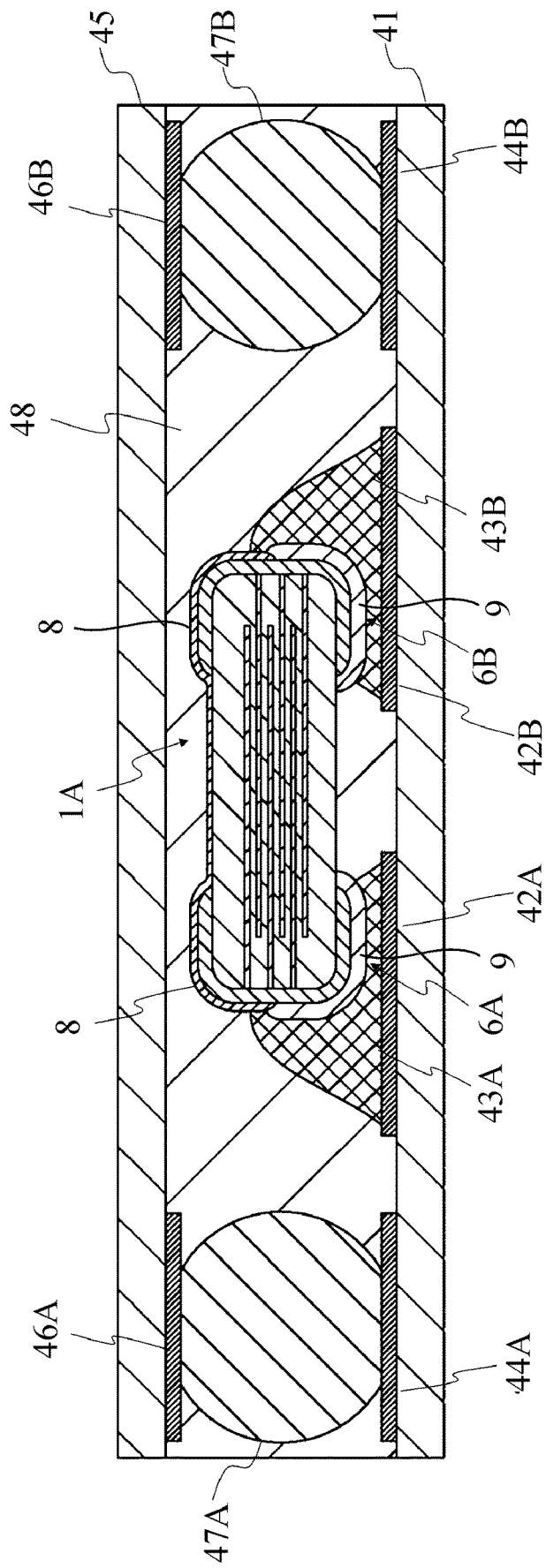
FIG. 5 is a cross-sectional view showing an arrangement according to a second embodiment of the present invention in which the multilayer ceramic capacitor is mounted on a mounting substrate.

FIG. 5 is a cross-sectional view showing an arrangement according to a second embodiment of the present invention, in which the multilayer ceramic capacitor 1A is mounted on a mounting substrate 41.

As shown in FIG. 5, land electrodes 42A, 42B, 44A, and 44B are formed on the reverse surface of the mounting substrate 41. The multilayer ceramic capacitor 1A is connected to the land electrodes 42A and 42B via solder layers 43A and 43B attached to the plating layers 9 of the external electrodes 6A and 6B, respectively.

In the process of soldering, each of the solder layers 43A and 43B wets up the side surface of the external electrodes 6A and 6B, but is positioned below the upper surface of the oxide layer 8.

Solder balls 47A and 47B are formed on the land electrodes 44A and 44B, respectively on the reverse surface of the mounting substrate 41.

On the other hand, a semiconductor chip, which is not shown, is mounted on the obverse surface of the mounting substrate 41. The semiconductor chip may be a microprocessor, a semiconductor memory, or an FPGA (Field-Programmable Gate Array), or an ASIC (Application Specific Integrated Circuit).

Land electrodes 46A and 46B are formed on the reverse surface of another mounting substrate 45. The mounting substrates 41 and 45 are connected to each other via solder balls 47A and 47B. The mounting substrate 45 can be used as a mother board on which the mounting substrate 41 is mounted.

The interval between the mounting substrates 41 and 45 is maintained constant by the solder balls 47A and 47B. In addition, a sealing resin 48 that encapsulates the multilayer ceramic capacitor 1A is filled in the space between the mounting substrates 41 and 45. The sealing resin 48 is, for example, an epoxy resin. After the mounting substrates 41 and 45 are connected to each other via the solder balls 47A and 47B, the resin 48 may be filled in the space between the mounting substrates 41 and 45 and cured. In this case, the sealing resin 48 covers the multilayer ceramic capacitor 1A, the solder layers 43A and 43B, and the solder balls 47A and 47B, and adheres to the oxide layer 8.

In a case in which the surface roughness Ra of the oxide layer 8 is equal to or greater than 0.20 micrometers, the adhesiveness between the oxide layer 8 and the sealing resin 48 can be improved. As a result, it is possible to prevent occurrence of a gap through which moisture can ingress between the multilayer ceramic capacitor 1A and the sealing resin 48, and to improve the reliability of the multilayer ceramic capacitor 1A encapsulated with the resin 48.

In addition, by mounting the multilayer ceramic capacitor 1A on the reverse surface of the mounting substrate 41, which is opposite to the obverse surface on which the semiconductor chip is mounted, the multilayer ceramic capacitor 1A can be arranged in close proximity to the semiconductor chip, thereby effectively eliminating noise affecting the semiconductor chip.

In addition, by setting the height of the multilayer ceramic capacitor 1A to 150 micrometers or less, the multilayer ceramic capacitor 1A can be interposed between the two mounting substrates 41 and 45 connected to each other via the solder balls 47A and 47B. As a result, a semiconductor chip can be mounted on the reverse surface of the mounting substrate 41 opposite to the obverse surface on which the multilayer ceramic capacitor 1A is mounted.

In addition, by forming the oxide layer 8 on the upper parts and the upper portions of the side parts of the base layer 7, it is possible to prevent the plating layer 9 from being formed on the upper parts and the upper portions of the side parts of the base layer 7. Accordingly, when the multilayer ceramic capacitor 1A is mounted to the substrate 41 with use of the solder layers 43A and 43B, it is possible to prevent solder from wetting up to protrude beyond the upper surface of the multilayer ceramic capacitor 1A through the plating layer 9. This makes it possible to arrange the multilayer ceramic capacitor 1A in the space between the mounting substrates 41 and 45, which are connected to each other via the solder balls 47A and 47B.

In addition, by making the thickness of the oxide layer 8 between one micrometer and five micrometers, when the multilayer ceramic capacitor 1A is mounted to the substrate 41 with use of the solder layers 43A and 43B, it is possible to prevent solder from wetting up to protrude beyond the upper surface of the multilayer ceramic capacitor 1A through the plating layer 9. This makes it possible to prevent the height of the multilayer ceramic capacitor 1A from increasing after mounting on the substrate 41 and to arrange the multilayer ceramic capacitor 1A in the space between the mounting substrates 41 and 45, which are connected to each other via the solder balls 47A and 47B.

In addition, by defining the lower limit of the lower edge of the oxide layer 8 on the side surface of the base layer 7 to within a half of the height of the multilayer ceramic capacitor 1A from the top surface of the oxide layer 8, it is possible to limit the area not covered with the solder layers 43A and 43B when mounting the multilayer ceramic capacitor 1A to the mounting substrate 41. In this way, it is possible to improve the adhesion strength of the external electrodes 6A and 6B to the mounting substrate 41.

In addition, by defining the upper limit of the lower edge of the oxide layer 8 on the side surface of the base layer 7 to be distant at least 10 micrometers from the top surface of the oxide layer 8, even if solder of the solder layers 43A and 43B wets up the side surface of the external electrodes 6A and 6B when the multilayer ceramic capacitor 1A is mounted to the mounting substrate 41, it is possible to prevent the solder from protruding beyond the top surface of the oxide layer 8. This makes it possible to arrange the multilayer ceramic capacitor 1A in the space between the mounting substrates 41 and 45, which are connected to each other via the solder balls 47A and 47B.

Figure 6A:
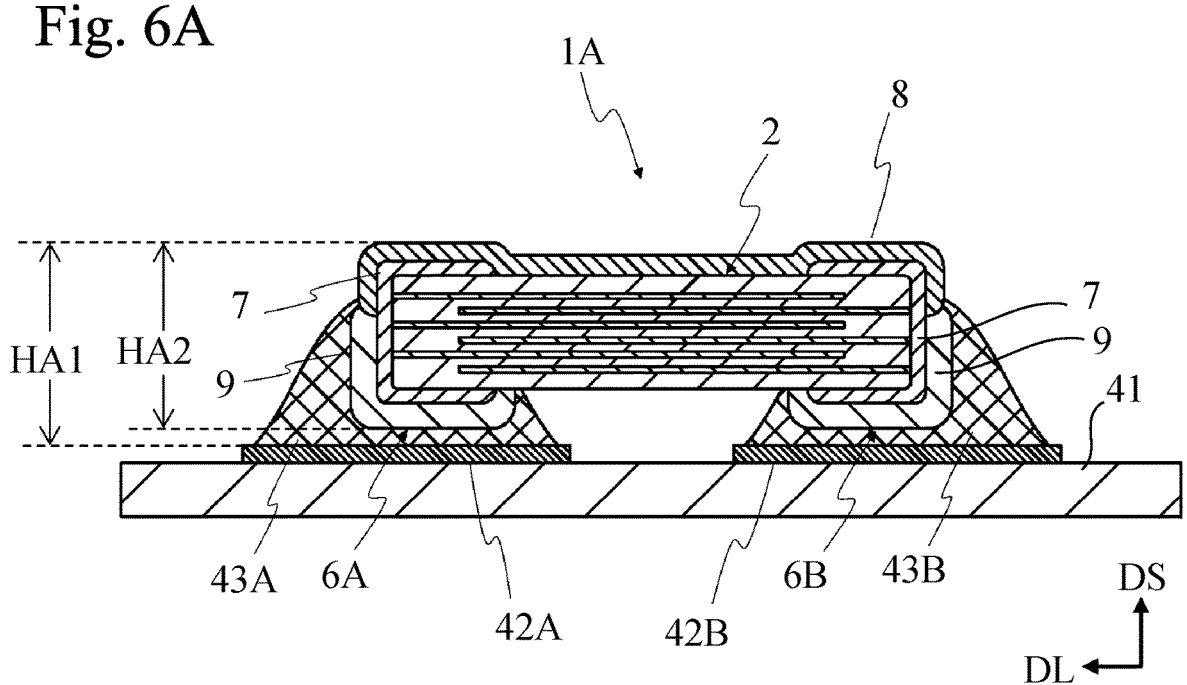
FIG. 6A is a cross-sectional view showing a relationship between the chip thickness and the height of the multilayer ceramic capacitor of FIG. 5 after mounting.
Figure 6B:
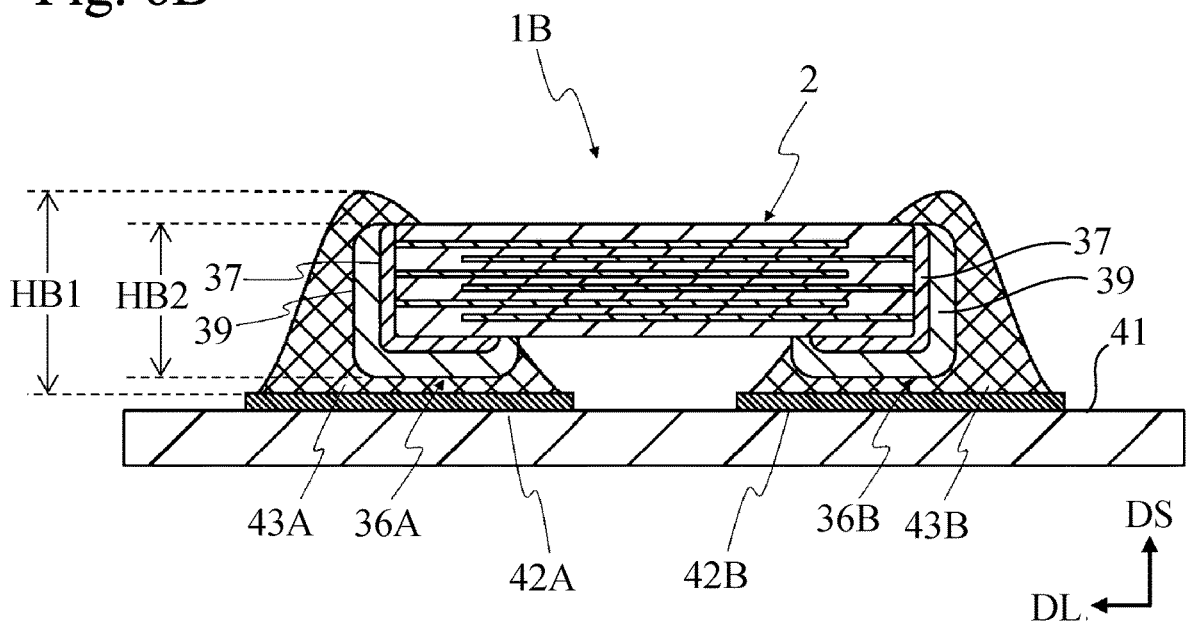
FIG. 6B is a cross-sectional view showing a relationship between the chip thickness and the height of a multilayer ceramic capacitor according to a comparative example after mounting.

FIG. 6A is a cross-sectional view showing a relationship between the chip thickness and the height of the multilayer ceramic capacitor of FIG. 5 after mounting. FIG. 6B is a cross-sectional view showing a relationship between the chip thickness and the height of a multilayer ceramic capacitor according to a comparative example after mounting.

As shown in FIG. 6A, the land electrodes 42A and 42B are formed on the reverse surface of the mounting substrate 41. The multilayer ceramic capacitor 1A is connected to the land electrodes 42A and 42B via the solder layers 43A and 43B, respectively, which are adhered to the plating layers 9 of the external electrode 6A and 6B. The height HA1 after mounting the multilayer ceramic capacitor 1A on the mounting substrate 41 is the height (or vertical distance) from the upper surfaces of the land electrodes 42A and 42B to the top surface of the oxide layer 8. The thickness HA2 of the multilayer ceramic capacitor 1A is the vertical distance from the bottom surfaces of the external electrodes 6A and 6B to the top surface of the oxide layer 8.

On the other hand, as shown in FIG. 6B, the multilayer ceramic capacitor 1B has the element body 2 and external electrodes 36A and 36B. Each of the external electrodes 36A and 36B has a base layer 37 formed on the element body 2 and a plating layer 39 formed on the base layer 37. The external electrodes 36A and 36B are different from the external electrodes 6A and 6B of FIG. 6A in that the base layers 37 in the external electrodes 36A and 36B are not formed on the upper surface of the element body 2, whereas the base layers 7 in the external electrodes 6A and 6B are formed on the upper surface of the element body 2. The base layer 37 covers the entirety of the side surface of the element body 2. In this case, the plating layer 39 is continuously formed to cover the entirety of the bottom surface and the side surface of the base layer 37.

The multilayer ceramic capacitor 1B is connected to the land electrodes 42A and 42B via the solder layers 43A and 43B, respectively, which are adhered to the plating layers 39 of the external electrode 6A and 6B. Since the plating layer 39 is formed on the entirety of the side surface of the base layer 37, the solder of the solder layers 33A and 33B wets up to the entire side surface of the base layer 37 and protrude beyond the top surface of the multilayer ceramic capacitor 1B. Accordingly, the height HB1 of the multilayer ceramic capacitor 1B after mounting on the mounting substrate 41 is the height (or vertical distance) from the upper surfaces of the land electrodes 42A and 42B to the top of the solder layers 33A and 33B. On the other hand, in the multilayer ceramic capacitor 1B, the oxide layer 8 is not formed on the upper surface of the element body 2 and on the upper surface of each of the external electrodes 36A and 36B. Accordingly, the thickness HB2 of the multilayer ceramic capacitor 1B is the vertical distance from the bottom of the external electrodes 36A and 36b to the upper surface of the element body 2.

In a case in which the multilayer ceramic capacitor 1B of FIG. 6B is applied to the arrangement shown in FIG. 5, the sealing resin 48 will adheres to the top surface of each of the solder layers 43A and 43B and the upper surface of the element body 2. In this case, there is a likelihood that a gap may be created between the multilayer ceramic capacitor 1B and the sealing resin 48 through which moisture can ingress, which will cause decrease in reliability of the multilayer ceramic capacitor 1B encapsulated with the resin 48. In addition, since the solder layers 33A and 33B protrude beyond the upper surface of the multilayer ceramic capacitor 1B, HB1 will be greater than HAL so that the multilayer ceramic capacitor 1B cannot be arranged in the space between the mounting substrates 41 and 45, which are connected to each other via the solder balls 47A and 47B.

Third Embodiment

Figure 7A:
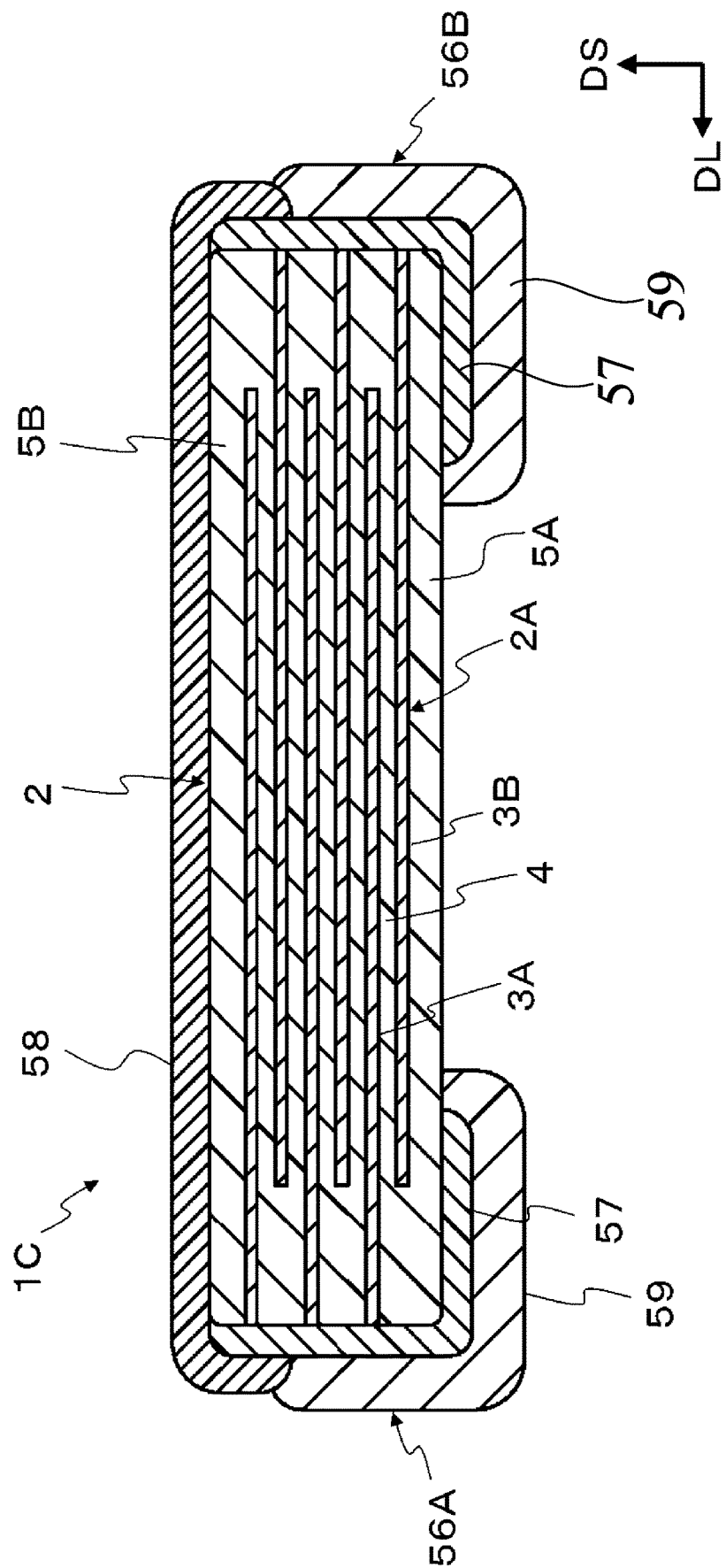
FIG. 7A is a cross-sectional view of a multilayer ceramic capacitor according to a third embodiment of the present invention taken in the same manner as in FIG. 2A.
Figure 7B:
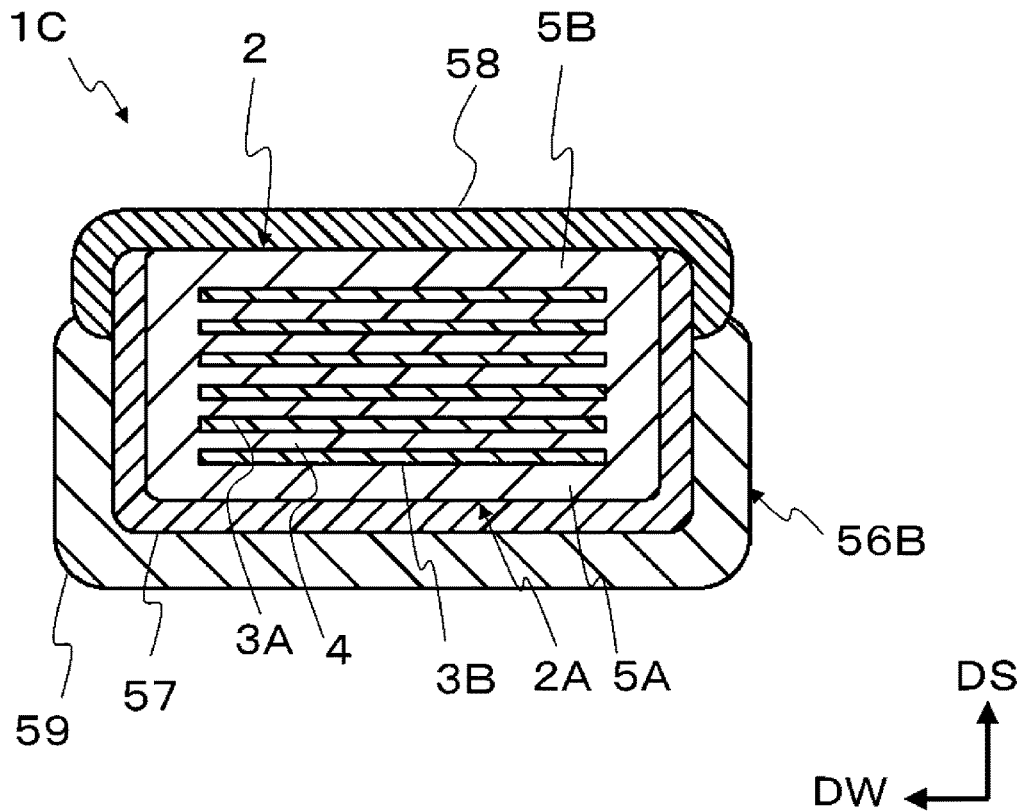
FIG. 7B is a cross-sectional view of the multilayer ceramic capacitor according to the third embodiment taken in the same manner as in FIG. 2B.
Figure 7C:
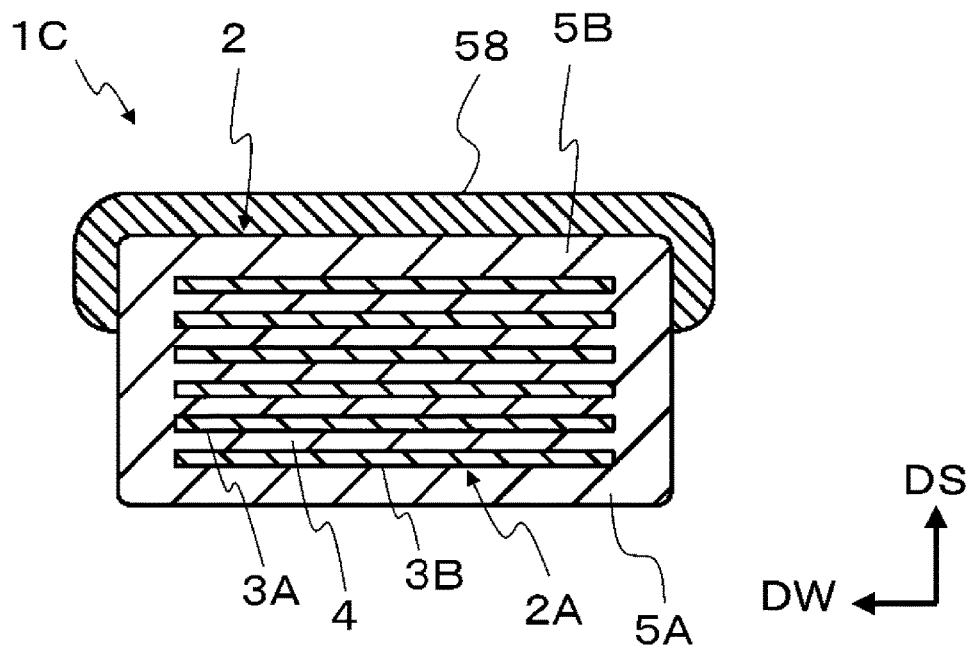
FIG. 7C is a cross-sectional view of the multilayer ceramic capacitor according to the third embodiment taken in the same manner as in FIG. 2C.

FIG. 7A is a cross-sectional view of a multilayer ceramic capacitor according to a third embodiment of the present invention taken in the same manner as in FIG. 2A. FIG. 7B is a cross-sectional view of the multilayer ceramic capacitor according to the third embodiment taken in the same manner as in FIG. 2B. FIG. 7C is a cross-sectional view of the multilayer ceramic capacitor according to the third embodiment taken in the same manner as in FIG. 2C.

As shown in FIGS. 7A to 7C, the multilayer ceramic capacitor 1C has the element body 2, external electrodes 56A and 56B, and an oxide layer 58. Each of the external electrode 56A and 56B has a base layer 57 formed on the element body 2 and a plating layer 59 formed on the base layer 57.

The external electrode 56A and 56B are different from the external electrodes 6A and 6B of FIG. 2A in that the base layers 57 in the external electrodes 56A and 56B are not formed on the upper surface of the element body 2, whereas the base layers 7 in the external electrodes 6A and 6B are formed on the upper surface of the element body 2. The oxide layer 58 is formed on the entirety of the upper surface of the element body 2.

To prevent the base layer 57 from being formed on the element body 2, the base layer 7 on the upper surface of the element body 2 in FIG. 2A may be removed by anisotropic etching or by mechanical grinding.

Other features of the base layers 57, the plating layers 59, and the oxide layer 58 can be the as the base layers 7, the plating layers 9 and the oxide layer 8 of FIG. 2A.

Since the base layer 57 of each of the external electrode 56A and 56B is not formed on the upper surface of the element body 2, the height of the multilayer ceramic capacitor 1C can be reduced by the thickness of the base layer 57, thereby reducing the height of the multilayer ceramic capacitor 1C.

Fourth Embodiment

Figure 8:
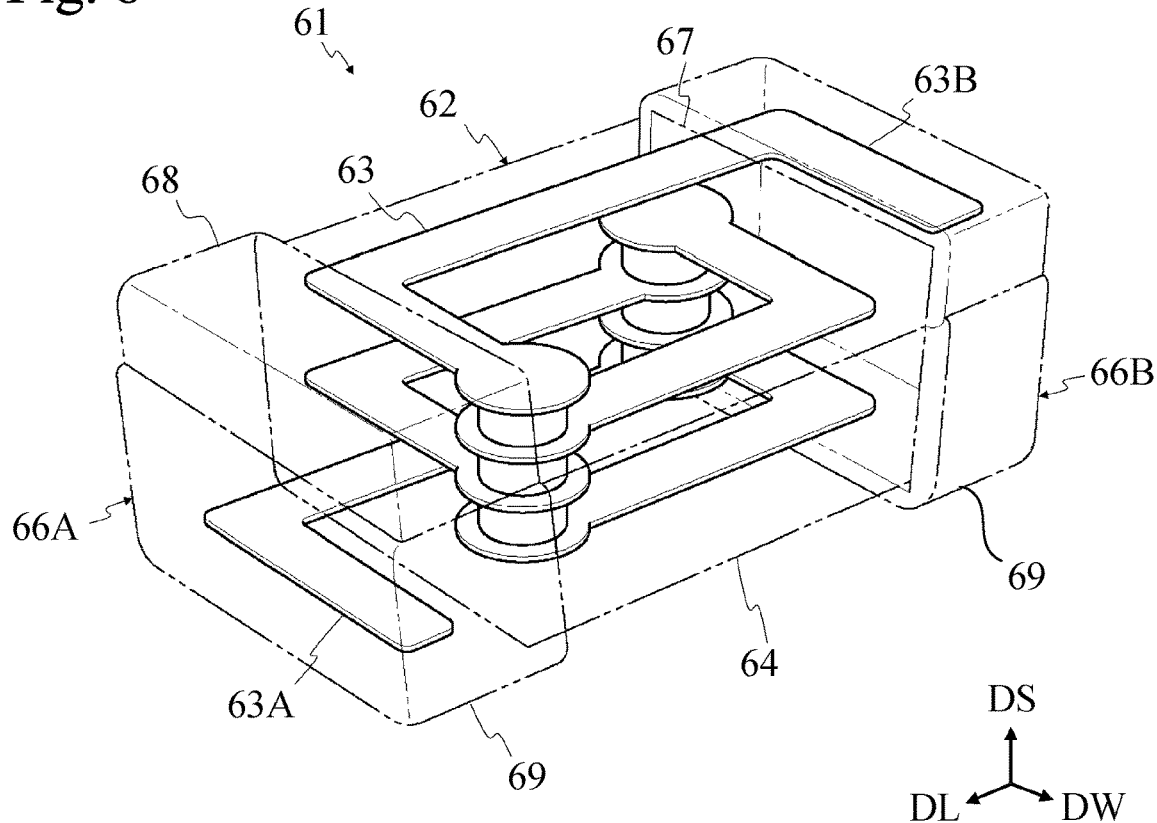
FIG. 8 is a perspective view showing a ceramic electronic component according to a fourth embodiment of the present invention

FIG. 8 is a perspective view showing a ceramic electronic component according to a fourth embodiment of the present invention. In FIG. 8, a chip inductor is taken as an example as a ceramic electronic component.

The chip inductor 61 includes an element body 62, two external electrodes 66A and 66B, and an oxide layer 68. The element body 62 includes a coil pattern 63 that includes two terminal segments 63A and 63B formed at both ends thereof and a magnetic material 64. The magnetic material 64 is used as a dielectric to insulate the internal electrode layers formed by the coil pattern 63. The shape of the element body 62 may be a substantially rectangular parallelepiped shape.

The external electrodes 66A and 66B are located on opposite sides of the element body 62, respectively, so that the external electrodes 66A and 66B are spaced (separated) from each other. Each of the external electrodes 66A and 66B continuously extends from the side surface of the element body 62 to the front and rear surfaces and the top and bottom surfaces of the element body 62.

The coil pattern 63 is embedded in the magnetic material 64. However, the terminal segment 63A is exposed from the magnetic material 64 on one side of the element body 62 and is connected to the external electrode 66A, whereas the terminal segment 63B is exposed from the magnetic material 64 on the other side of the element body 62 and is connected to the external electrode 66B.

The material of the coil pattern 63 and the terminal segments 63A and 63B may be, for example, a metal such as Cu, Ni, Ti, Ag, Au, Pt, Pd, Ta, and W, or an alloy containing at least one of these metals. The magnetic material 64 is, for example, a ferrite.

Each of the external electrodes 66A and 66B can be configured in the same manner as that of the external electrodes 6A and 6B in FIG. 1. In other words, each of the external electrodes 66A and 66B has a base layer 67 and a plating layer 69. Each of the base layers 67 is continuously formed on the lower surface (mounting surface), the upper surface, the side surface, the front surface, and the rear surface of the element body 62. Each of the plating layers 69 is continuously formed on the lower surface, the lower part of the side surface, the lower portion of the front surface, and the lower portion of the rear surface of the base layer 67. The base layer 67 may include co-material particles dispersed in a metal. The co-material is, for example, a ferrite component that is the main component of the magnetic material 64.

An oxide layer 68 is formed on the top surface of the element body 62 opposite to the mounting surface (the bottom surface of the element body 62). The surface roughness Ra of the oxide layer 68 may be equal to or greater than 0.20 micrometers. The oxide layer 68 is continuously formed on the top surface of the element body 62 and the top surfaces, the side surfaces, the front surfaces, and the rear surfaces of the base layers 67.

Each of the plating layers 69 is continuously formed on the lower surface, the lower part of the side surface, the lower portion of the front surface, and the lower portion of the rear surface of the base layer 67, and is in contact with the oxide layer 68 on the side part, the front part, and the rear part of the base layer 67.

Each of the side parts of the oxide layer 68 may have a lower edge located in a range having an upper limit and a lower limit. The upper limit is distant at least 10 micrometers from the top surface of the oxide layer 68, whereas the lower limit is from the top surface of the oxide layer 68 within a half of the height of the chip inductor 61 (the distance between the top surface of the oxide layer 68 and the lower surfaces of the external electrodes 66A and 66B).

The oxide layer 68 may have the same composition as the magnetic material 64. For example, the material of the oxide layer 68 is ferrite, but the material of the oxide layer 68 may be iron oxide or chromium oxide. The thickness of the oxide layer 68 is preferably between one micrometer and five micrometers.

The external dimensions of an example of the chip inductor 61 may be as follows: the length>the width>the height, or the length>the width=the height. To reduce the height of the chip inductor 61, the height of the chip inductor 61 is preferably 150 micrometers or less.

In a case in which the surface roughness Ra of the oxide layer 68 is equal to or greater than 0.20 micrometers, when the multilayer ceramic capacitor 1A is sealed with resin, the adhesiveness between the oxide layer 68 and the sealing resin can be improved. As a result, it is possible to prevent occurrence of a gap through which moisture can ingress between the chip inductor 61 and the sealing resin, and to improve the reliability of the resin-encapsulated chip inductor 61.

Working Examples

Working examples of the multilayer ceramic capacitor 1A shown in FIG. 6A will be described below. 77 samples of the multilayer ceramic capacitor 1A of type 042 according to the Japanese Industrial Standards (JIS) were prepared, whereas 77 samples of the multilayer ceramic capacitor 1B shown in FIG. 6B were prepared.

For each sample, green sheets having a thickness of one micrometer were made of a high dielectric material (barium titanate). Next, internal electrode patterns were formed on green sheets by a printing method, and the green sheets with the internal electrode patterns and the green sheets without the internal electrode patterns were stacked to obtain a stacked block. The thickness of the green sheets and the number of stacked sheets were designed so that the thickness of the multilayer ceramic capacitor 1A is 70 micrometers, taking into account the thickness of the base layer 7, the thickness of the plating layer 9, and the shrinkage during sintering. More specifically, twelve internal electrode layers 3A and 3B are stacked in total.

The stacked block was cut at predetermined positions to obtain element bodies 2. A conductive paste for the base layers was applied to both side surfaces and the remaining four surfaces (upper, lower, front, and rear surfaces) of each element body 2 for the samples according to the embodiment shown in FIG. 6A. The conductive paste was applied to both side surfaces, the lower surface, the front surface, and the rear surface of each element body 2 for the samples according to the comparative example shown in FIG. 6B.

Next, for the samples according to the embodiment shown in FIG. 6A, an oxide paste containing barium titanate, a binder, and a solvent was applied to the upper surface, the side surfaces, the front surface and the rear surface of the conductive paste and the upper surface of the element body 2, using a dip method. In this case, the depth of dipping the element body 2 into the oxide paste was adjusted such that the lower edge of the side parts of the oxide layers 8 on the base layers 7 was 15 micrometers below the top surface of the multilayer ceramic capacitor 1A. However, the lower edge of the oxide paste may be 10 micrometers to 35 micrometers (a half of the height of the multilayer ceramic capacitor 1A, 70 micrometers) from the top surface of the multilayer ceramic capacitor 1A.

The amount of barium titanate contained in the oxide paste was 20 to 70% such that the thickness of the oxide layer 8 was 5 micrometers and the surface roughness Ra was 0.20 micrometers or more after sintering.

Each of the element bodies 2 was sintered at a temperature range from 1000 degrees Celsius to 1400 degrees Celsius. Then, electroplating was applied to produce the multilayer ceramic capacitors 1A and 1B. Then, the multilayer ceramic capacitors 1A and 1B are mounted to the mounting substrates 41 as shown in FIGS. 6A and 6B.

The height HA1 after mounting was measured for samples of the multilayer ceramic capacitor 1A shown in FIG. 6A. The height HB1 after mounting was measured for samples of the multilayer ceramic capacitor 1B shown in FIG. 6B. In addition, the multilayer ceramic capacitors 1A and 1B mounted on the mounting substrates 41 were sealed with resin, and the moisture resistance was confirmed for each sample. The length of the multilayer ceramic capacitors 1A and 1B was 400 micrometers, the width thereof was 200 micrometers, the height thereof was 70 micrometers. The number of internal electrode layers 3A and 3B was twelve as described above.

Figure 9:
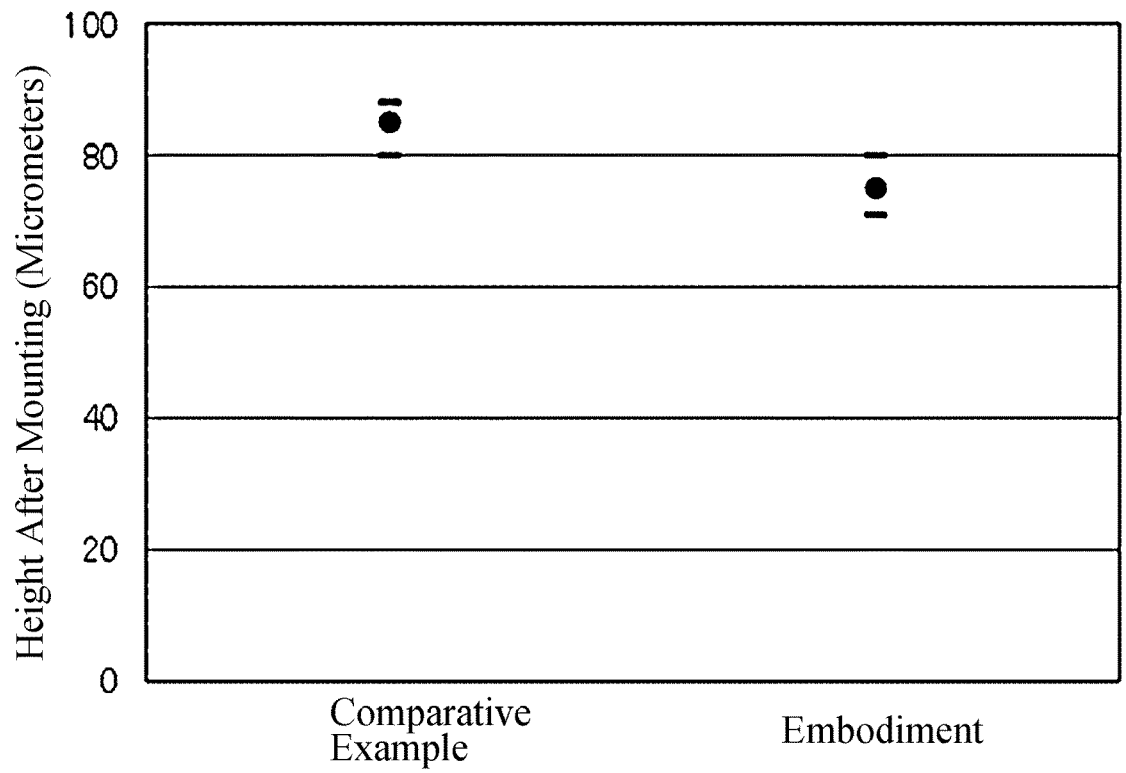
FIG. 9 is a graph showing the height of the multilayer ceramic capacitor of FIG. 6A after mounting compared with the height of the multilayer ceramic capacitor of FIG. 6B after mounting.

FIG. 9 is a graph showing the height of the multilayer ceramic capacitor of FIG. 6A after mounting according to the embodiment compared with the height of the multilayer ceramic capacitor of FIG. 6B after mounting according to the comparative example.

As shown in FIG. 9, for the samples of the multilayer ceramic capacitor 1B of FIG. 6B, the height HB1 after mounting was 80 to 90 micrometers, and the average of the height HB1 after mounting was 87 micrometers. On the other hand, for the samples of the multilayer ceramic capacitor 1A shown in FIG. 6A, the height HA1 after mounting was 70 to 80 micrometers, and the average of the height HA1 after mounting was 77 micrometers. These results show that the height HA1 of the multilayer ceramic capacitor 1A after mounting can be lower than the height HB1 of the multilayer ceramic capacitor 1B after mounting.

FIG. 10 is a table showing a relationship among the thickness of an oxide layer, the position of the lower edge of the oxide layer, and the height of multilayer ceramic capacitors of FIG. 6A after mounting.

In FIG. 10, samples 1 to 12 correspond to the embodiment shown in FIG. 6A, whereas comparative example 1 corresponds to the comparative example shown in FIG. 6B. For each of samples 1 to 12, the height HA1 after mounting on the mounting substrate 41 was measured while the thickness of the oxide layer 8 and the distance between lower edge of oxide layer 8 and top surface of oxide layer 8 were changed. The height of the external electrodes is the height (thickness) of the multilayer ceramic capacitor 1A excluding the thickness of the oxide layer 8.

For comparative example 1, which does not have the oxide layer 8, the height HB1 of the multilayer ceramic capacitor 1B after mounting on the mounting substrate 41 shown in FIG. 6B was measured. The height of the external electrodes is the height (thickness HB2) of the multilayer ceramic capacitor 1B.

In FIG. 10, the chip thickness is the sum of the height of the external electrodes and the thickness of the oxide layer 8. The height after mounting is the vertical distance between the top surfaces of the land electrodes 42A and 42B and the top of the structure. More specifically, for samples 1 to 4 and 7 to 12, the height after mounting is the sum of the chip thickness and the thickness of the solder layers 43A and 43B between the top surfaces of the land electrodes 42A and 42B and the bottom surfaces of the external electrodes. For samples 5 and 6, and comparative example 1, the height after mounting is the sum of the chip thickness, the thickness of the solder layers 43A and 43B between the top surfaces of the land electrodes 42A and 42B and the bottom surfaces of the external electrodes, and the amount of protrusion of the solder layer 43A or 43B from the top surface of the external electrode.

In the multilayer ceramic capacitor 1A, in cases in which the distance between lower edge of oxide layer 8 and top surface of oxide layer 8 was 15 micrometers, and if the thickness of the oxide layer 8 was 0.5 micrometers or more, the solder layer 43A or 43B did not protrude upwardly from the upper surfaces of the external electrodes 6A and 6B. However, if the thickness of the oxide layer 8 was 0.5 micrometers, the oxide layer 8 was discontinuous and the adhesiveness of the oxide layer 8 with the sealing resin was weak. For this reason, it is preferable that the thickness of the oxide layer 8 be one micrometer or more.

On the other hand, in cases in which the thickness of the oxide layer 8 was increased, the height of the multilayer ceramic capacitor 1A after mounting was great. Accordingly, to minimize the height of the multilayer ceramic capacitor 1A after mounting, a thinner oxide layer 8 is preferred, and it is preferable that the thickness of the oxide layer 8 be five micrometers or less.

In cases in which the thickness of the oxide layer 8 was five micrometers, and if the distance between lower edge of oxide layer 8 and top surface of oxide layer 8 was 10 micrometers or more, the solder layer 43A or 43B did not protrude upwardly from the upper surfaces of the external electrodes 6A and 6B. Accordingly, it is preferable that the distance between lower edge of oxide layer 8 and top surface of oxide layer 8 be 10 micrometers or more. However, if the distance between lower edge of oxide layer 8 and top surface of oxide layer 8 was too large, the solder of the solder layers 43A and 43B could not sufficiently wet up to the side surfaces of the external electrodes 6A and 6B, so that the adhesion strength of the external electrodes 6A and 6B to the mounting substrate 41 was small. Accordingly, it is preferable that the distance between lower edge of oxide layer 8 and top surface of oxide layer 8 be equal to or less than a half of the height of the multilayer ceramic capacitor 1A.

FIG. 11 is a table showing the moisture resistance of the multilayer ceramic capacitor of FIG. 6A after resin encapsulation compared to that of the multilayer ceramic capacitor of FIG. 6B after resin encapsulation.

A test for moisture resistance was conducted for comparative example A (Ra=0.13 micrometers), comparative example B (Ra=0.17 micrometers), working example C (Ra=0.21 micrometers), working example D (Ra=0.31 micrometers). In each of comparative examples A and B and working examples C and D, the thickness of the oxide layer 8 was five micrometers, and the distance between lower edge of oxide layer 8 and top surface of oxide layer 8 was 15 micrometers. The number of samples of each of comparative examples A and B and working examples C and D was 77.

In the moisture resistance test, a DC voltage of 10 volts was applied between the external electrodes for 100 hours under an environment of a temperature of 85 degrees Celsius and a humidity of 85%. Thereafter, the IR (insulation resistance) was measured, and samples with an IR of 100 megaohms or less were judged to be failed.

As shown in FIG. 11, in cases in which the surface roughness Ra of the oxide layer 8 was less than 0.20 micrometers, some samples were judged to be failed. In cases in which the surface roughness Ra of the oxide layer 8 is greater than 0.20 micrometers, there was no sample in which a failure occurred. Accordingly, it was confirmed that the moisture resistance of the multilayer ceramic capacitor could be improved by making the surface roughness Ra of the oxide layer 8 be equal to or greater than 0.20 micrometers.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A ceramic electronic component comprising:
    an element body including a dielectric and internal electrodes, the element body having an upper surface, a lower surface, and side surfaces;
    external electrodes formed on multiple surfaces of the element body, each of the external electrodes including a base layer and a plating layer, the base layer containing metal and having a lower part formed on the lower surface of the element body and a side part formed on one of the side surfaces of the element body and being connected to one or more of the internal electrodes, the plating layer being formed on the lower part of the corresponding base layer; and
    an oxide layer formed on the upper surface of the element body, the oxide layer having a surface roughness Ra that is equal to or greater than 0.20 micrometers.

2. The ceramic electronic component according to claim 1,
    wherein the base layer of each of the external electrodes further includes an upper part formed on the upper surface of the element body, and wherein the oxide layer is formed on the upper parts of the base layers.

3. The ceramic electronic component according to claim 1, wherein the base layers of each of the external electrodes further includes an upper part formed on the upper surface of the element body,
wherein the oxide layer continuously covers the upper surface of the element body and the respective upper parts and the side parts of the base layers of the external electrodes, and
wherein the plating layer of each of the external electrodes is formed on the lower part and the side part of the corresponding base layer and is in contact with the oxide layer on the side part of the base layer, the plating layers of each of the external electrodes being absent on the upper surface of the element body.

4. The ceramic electronic component according to claim 1, wherein the element body further has a front surface and a rear surface,
wherein the base layer of each of the external electrodes further includes an upper part formed on the upper surface of the element body, a front part formed on the front surface of the element body, and a rear part formed on the rear surface of the element body,
wherein the oxide layer continuously covers the upper surface, the front surface, and the rear surface of the element body, and the upper parts, the side parts, the front parts, and the rear parts of the base layers of the external electrodes, and
wherein the plating layer of each of the external electrodes is formed on the lower part, the side part, the front part, and the rear part of the corresponding base layer and is in contact with the oxide layer on the side part, the front part, and the rear part of the base layer, the plating layer of each of the external electrodes being absent on the upper surface of the element body.

5. The ceramic electronic component according to claim 1, wherein the oxide layer further includes side parts formed on the respective side parts of the base layers, and
wherein the plating layer of each of the external electrodes is absent on an upper surface of the oxide layer, and covers one of the side parts of the oxide layer.

6. The ceramic electronic component according to claim 1, wherein the oxide layer further includes side parts formed on the respective side parts of the base layers, and
wherein each of the side parts of the oxide layer has a lower edge located in a range having an upper limit and a lower limit, the upper limit being distant at least 10 micrometers from an upper surface of the oxide layer, the lower limit being from the upper surface of the oxide layer within a half of a distance between the upper surface of the oxide layer and a lower surface of the external electrode.

7. The ceramic electronic component according to claim 1, wherein a distance between an upper surface of the oxide layer and a lower surface of the external electrode is 150 micrometers or less.

8. The ceramic electronic component according to claim 1, wherein the oxide layer has a thickness that is from one micrometer to five micrometers.

9. The ceramic electronic component according to claim 1, wherein the dielectric is made of a material having a main component, and wherein the oxide layer is made of a material having a main component that is the same as the main component of the dielectric.

10. The ceramic electronic component according to claim 1, wherein the oxide layer is made of an oxide ceramic.

11. The ceramic electronic component according to claim 1, wherein the oxide layer is made of a material containing at least one of barium titanate, strontium titanate, calcium titanate, magnesium titanate, barium strontium titanate, barium calcium titanate, calcium zirconate, barium zirconate, calcium titanate zirconate, titanium oxide, silicon oxide, and aluminum oxide.

12. The ceramic electronic component according to claim 1, wherein the base layer of each of the external electrodes contains a co-material dispersed in the metal.

13. The ceramic electronic component according to claim 12, wherein the co-material is an oxide ceramic.

14. The ceramic electronic component according to claim 1, wherein the element body is a laminate in which first internal electrode layers and second internal electrode layers are alternately stacked with dielectric layers interposed therebetween,
wherein the external electrodes include a first external electrode and a second external electrode provided on mutually opposing sides of the laminate,
wherein the first internal electrode layers are connected to the first external electrode, and
wherein the second internal electrode layers are connected to the second external electrode.

15. The ceramic electronic component according to claim 1, wherein the surface roughness of the oxide layer is greater than a surface roughness of the element body and a surface roughness of the base layer.

16. An arrangement comprising:
a mounting substrate; and
the ceramic electronic component according to claim 1 mounted on a surface of the mounting substrate, the ceramic electronic component being connected to the mounting substrate via solder layers, the solder layers being adhered to the plating layers of the external electrodes, respectively,
wherein each of the solder layers is in surface contact with a side surface of the corresponding plating layer and is located below an upper surface of the oxide layer.

17. The arrangement according to claim 16, further comprising a resin layer that encapsulates the ceramic electronic component on the mounting substrate, no gap existing between the resin layer and the oxide layer through which moisture can ingress.

18. The arrangement according to claim 17, further comprising solder balls formed on the surface of the mounting substrate, the surface being the same as the surface on which the ceramic electronic component is mounted.

19. The arrangement according to claim 18, further comprising another mounting substrate connected electrically with the mounting substrate via the solder balls, wherein the ceramic electronic component is interposed between the mounting substrate and said another mounting substrate.

20. A method of manufacturing a ceramic electronic component, the method comprising:
forming an element body that includes a dielectric and internal electrodes, the element body having an upper surface, a lower surface, and side surfaces;
applying a base material for base layers of external electrodes onto the lower surface and the side surfaces of the element body;
applying an oxide material for an oxide layer onto the upper surface of the element body and onto portions of the base material that are on the side surfaces;
thereafter, sintering the base material and the oxide material to form the base layers of the external electrodes and the oxide layer, the base layer of each of the external electrodes having a lower part formed on the lower surface of the element body and a side part formed on one of the side surfaces of the element body and being connected to one or more of the internal electrodes, the oxide layer being formed on the upper surface of the element body and on the respective portions of the base layers on the side surfaces, the oxide layer having a surface roughness Ra that is equal to or greater than 0.20 micrometers; and forming plating layers on the base layers, respectively, each of the plating layers being formed on the lower part and the side part of one of the base layers.

\* \* \* \* \*